United States Patent
Jiang et al.

(10) Patent No.: US 11,811,147 B2
(45) Date of Patent: Nov. 7, 2023

(54) METHOD FOR CALIBRATING PHASED ARRAY ANTENNA AND RELATED APPARATUS

(71) Applicant: HUAWEI TECHNOLOGIES CO., LTD., Guangdong (CN)

(72) Inventors: Tao Jiang, Shanghai (CN); Jing Li, Shanghai (CN); Zhiwei Zhang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 487 days.

(21) Appl. No.: 17/141,776

(22) Filed: Jan. 5, 2021

(65) Prior Publication Data

US 2021/0126362 A1    Apr. 29, 2021

Related U.S. Application Data

(63) Continuation of application No. PCT/CN2018/094804, filed on Jul. 6, 2018.

(51) Int. Cl.
*H01Q 3/26* (2006.01)
*H04B 17/11* (2015.01)
(Continued)

(52) U.S. Cl.
CPC ............... *H01Q 3/267* (2013.01); *H01Q 3/36* (2013.01); *H04B 17/11* (2015.01); *H04B 17/21* (2015.01)

(58) Field of Classification Search
CPC .......... H01Q 3/267; H01Q 3/36; H04B 17/11; H04B 17/21; G01R 29/10
See application file for complete search history.

(56) References Cited

U.S. PATENT DOCUMENTS

| 5,175,558 A | 12/1992 | Dupree |
| 6,157,343 A | 12/2000 | Andersson et al. |

(Continued)

FOREIGN PATENT DOCUMENTS

| CA | 2946011 A1 | 4/2018 |
| CN | 1324504 A | 11/2001 |

(Continued)

OTHER PUBLICATIONS

Extended European Search Report in European Application No. 18925613.4, dated Apr. 20, 2021, 5 pages.

(Continued)

*Primary Examiner* — David E Lotter
(74) *Attorney, Agent, or Firm* — Fish & Richardson P.C.

(57) ABSTRACT

One example method includes transmitting a test signal through the transmit channel n, where the test signal is radiated by a service antenna element n corresponding to the transmit channel n and is received by a calibration antenna element in the phased array antenna. N coupling signals received by N calibration antenna elements coupled to the service antenna element n can then be obtained. Delay weighting can then be performed on the N coupling signals based on relative positions of the service antenna element n and each of the N calibration antenna elements to obtain N calibration signals. The N calibration signals can then be combined into the calibration signal corresponding to the transmit channel n. Calibration signals corresponding to all transmit channels in the phased array antenna can then be obtained. At least one of amplitudes or phases of the transmit channels can then be compensated for.

18 Claims, 10 Drawing Sheets

(51) Int. Cl.
*H04B 17/21* (2015.01)
*H01Q 3/36* (2006.01)

(56) References Cited

U.S. PATENT DOCUMENTS

| | | | |
|---|---|---|---|
| 6,208,287 B1 | 3/2001 | Sikina et al. | |
| 6,693,588 B1* | 2/2004 | Schlee | H01Q 3/267 |
| | | | 342/368 |
| 6,747,595 B2 | 6/2004 | Hirabe | |
| 6,983,127 B1 | 1/2006 | Da Torre et al. | |
| 8,085,189 B2 | 12/2011 | Scott | |
| 8,212,716 B2 | 7/2012 | Goshen et al. | |
| 2017/0077613 A1* | 3/2017 | Banu | H04B 1/18 |

FOREIGN PATENT DOCUMENTS

| | | |
|---|---|---|
| CN | 1384989 A | 12/2002 |
| CN | 1540903 A | 10/2004 |
| CN | 1879311 A | 12/2006 |
| CN | 101064902 A | 10/2007 |
| CN | 101529741 A | 9/2009 |
| CN | 101582714 A | 11/2009 |
| CN | 102386983 A | 3/2012 |
| CN | 102412441 A | 4/2012 |
| CN | 102780518 A | 11/2012 |
| CN | 101904051 B | 12/2013 |
| CN | 103997352 A | 8/2014 |
| CN | 104426615 A | 3/2015 |
| CN | 104917574 A | 9/2015 |
| CN | 204857954 U | 12/2015 |
| CN | 105259544 A | 1/2016 |
| CN | 105390814 A | 3/2016 |
| CN | 106850037 A | 6/2017 |
| CN | 106990394 A | 7/2017 |
| CN | 107092013 A | 8/2017 |
| CN | 107315183 A | 11/2017 |
| CN | 107329125 A | 11/2017 |
| CN | 108155958 A | 6/2018 |
| EP | 1724875 A1 | 11/2006 |
| EP | 1833186 A1 | 9/2007 |
| JP | 5938114 B1 | 6/2016 |
| WO | 2005053094 A1 | 6/2005 |
| WO | 2009027725 A1 | 3/2009 |
| WO | 2009083961 A1 | 7/2009 |

OTHER PUBLICATIONS

Office Action issued in Chinese Application No. 201880095365.3 dated Apr. 6, 2021, 10 pages (with English translation).

PCT International Search Report and Written Opinion issued in International Application No. PCT/CN2018/094804 dated Mar. 22, 2019, 12 pages (partial English translation).

Chen et al., "A Novel On-Board And Amplitude-only Measurement Method For Phase Array Calibration," 2016 IEEE 5th Asia-Pacific Conference on Antennas and Propagation (APCAP), Jul. 2016, 2 pages.

Faxin, "Research on The Online Measurement of Amplitude And Phase Characteristic Value Errors of Phased Array Antenna," Doctoral Dissertation, National University of Defense Technology, Nov. 2013, 67 pages (English abstract).

Office Action issued in Chinese Application No. 201880095365.3 dated Jun. 3, 2021, 7 pages (with English translation).

* cited by examiner

METHOD FOR CALIBRATING PHASED ARRAY ANTENNA AND RELATED APPARATUS

CROSS-REFERENCE TO RELATED APPLICATIONS

This application is a continuation of International Application No. PCT/CN2018/094804, filed on Jul. 6, 2018, the disclosure of which is hereby incorporated by reference in its entirety.

TECHNICAL FIELD

This application relates to the field of communications technologies, and in particular, to a method for calibrating a phased array antenna and a related apparatus.

BACKGROUND

A phased array antenna is an antenna array including a plurality of antenna elements. A direction in which the strength of radiation in an antenna pattern has a maximum value may be changed by controlling an amplitude phase (an amplitude and a phase) of each antenna element, to scan a radiated beam in a specific direction. An antenna element in the phased array antenna is also referred to as a service antenna element, and performance of the phased array antenna highly depends on amplitude phase precision of each service antenna element. Ideally, in a working process of the phased array antenna, each service antenna element has a specific amplitude phase, and the service antenna elements do not interfere with each other. However, actually, in the phased array antenna, because a circuit channel corresponding to each service antenna element is not ideal, an amplitude phase of each service antenna element fluctuates relatively greatly. A change in the amplitude phase of each service antenna element causes a change in characteristics such as the radiation directivity of the antenna array. Consequently, if amplitude phase precision of an antenna channel corresponding to each service antenna element is reduced, performance of the phased array antenna deteriorates. Therefore, how to ensure amplitude phase precision of each antenna channel in the phased array antenna to ensure performance stability of the phased array antenna becomes one of technical problems to be urgently resolved.

In the prior art, to calibrate each antenna channel in a phased array antenna, in a solution, a plurality of calibration antenna elements are deployed around the phased array antenna, and each calibration antenna element is used to calibrate an antenna channel in an area covered by the calibration antenna element. However, in the prior art, each calibration antenna element separately covers one area on an outer surface of the phased array antenna, and the calibration antenna element has a poor coverage effect on each service antenna element in the area. To be specific, in an area covered by a calibration antenna element, because distances from service antenna elements in the area to the calibration antenna element are different, coupling degrees between the service antenna elements in the area and the calibration antenna element are greatly different. Consequently, quality of a calibration signal obtained by the calibration antenna element is poor, and a calibration effect is poor. As a result, applicability is low.

SUMMARY

Embodiments of this application provide a method for calibrating a phased array antenna and a related apparatus, to improve quality of calibrating the phased array antenna and reliability of the phased array antenna, and enhance performance stability of the phased array antenna. Therefore, applicability is higher.

According to a first aspect, an embodiment of this application provides a method for calibrating a phased array antenna. A phased array antenna to which the method is applicable includes a plurality of service antenna elements and a plurality of calibration antenna elements that are deployed independently of the plurality of service antenna elements, the plurality of service antenna elements are grouped into a plurality of antenna subarrays based on the plurality of calibration antenna elements, and one calibration antenna element corresponds to one antenna subarray. The method includes: performing the following operations on a test signal transmitted through any transmit channel (for example, a transmit channel n) in the phased array antenna to obtain a calibration signal corresponding to the transmit channel n:

transmitting any test signal through the transmit channel n, where the test signal is radiated by a service antenna element (for example, a service antenna element n) corresponding to the transmit channel n and is received by a calibration antenna element in the phased array antenna;

obtaining N coupling signals received by N calibration antenna elements coupled to the service antenna element n, where N is greater than or equal to 2 and is less than or equal to a total quantity of calibration antenna elements in the phased array antenna; and performing delay weighting on the N coupling signals based on relative positions of the service antenna element n and each of the N calibration antenna elements to obtain N calibration signals aligned in time domain; and combining the N calibration signals into the calibration signal corresponding to the transmit channel n;

The foregoing operations are repeated to obtain calibration signals corresponding to all transmit channels in the phased array antenna. Amplitudes and/or phases of the transmit channels are compensated for based on a difference between the amplitudes and/or the phases of the calibration signals corresponding to the transmit channels in the phased array antenna, so that the transmit channels in the phased array antenna have equal amplitudes and/or phases.

In this embodiment of this application, to calibrate the transmit channels, a signal transmitted through each transmit channel in the phased array antenna may be processed to obtain an optimal calibration signal corresponding to each transmit channel. Further, the amplitudes and/or the phases of the transmit channels in the phased array antenna may be compensated for, so that the transmit channels in the phased array antenna have equal amplitudes and/or phases. In this way, an optimal signal-to-noise ratio of a signal radiated by the phased array antenna can be ensured, and performance of the phased array antenna can be guaranteed. Implementation complexity is low, and applicability is higher.

With reference to the first aspect, in a possible implementation, the N calibration antenna elements in the phased array antenna that are coupled to the service antenna element n include a calibration antenna element (for example, a calibration antenna element n) corresponding to an antenna subarray to which the service antenna element n belongs. Obtaining N coupling signals received by N calibration antenna elements coupled to the service antenna element n includes: obtaining a first coupling signal between the service antenna element n and the calibration antenna element n, and determining, in the calibration antenna elements in the phased array antenna that are coupled to the service antenna element n, N−1 calibration antenna elements other than the calibration antenna element n based on a signal-to-noise ratio of the first coupling signal; and obtaining N−1 coupling signals received by the N−1 calibration antenna elements, to obtain the N coupling signals that include the first coupled signal, where the N calibration antenna elements are coupled to the service antenna element n at time points $t_0$ to $t_{N-1}$ respectively.

In this embodiment of this application, transmit channels corresponding to service antenna elements in different positions may be calibrated by using different quantities of calibration antenna elements, to control, for the service antenna elements in the different positions, beams that point to different directions in antenna patterns, thereby obtaining an optimal signal-to-noise ratio of a signal radiated by a service antenna element in each position. Optionally, a transmit channel corresponding to a service antenna element that is relatively close to a calibration antenna element may be calibrated by using the single calibration antenna element by sending and/or receiving a signal. Because a coupling degree between a service antenna element and a calibration antenna element decreases as a distance between the two antenna elements increases, a transmit channel corresponding to a service antenna element that is relatively far away from a calibration antenna element may be calibrated by using a plurality of calibration antenna elements by sending and/or receiving signals. A quantity (that is, N in N−1) of calibration antenna elements and positions of the calibration antenna elements may be determined and selected based on a signal-to-noise ratio of the coupling signal n in combination with a signal-to-noise ratio requirement for receiving a strongest coupling signal by the calibration antenna element in the phased array antenna and a position of each calibration antenna element in the phased array antenna, so that each calibration antenna element can receive a strongest coupling signal. The time points $t_0$ to $t_{n=N-1}$ are evenly distributed, and time intervals each are less than half a bandwidth for transmitting a signal through the transmit channel n.

With reference to the first aspect, in a possible implementation, compensating for amplitudes of the transmit channels based on a difference between amplitudes of the calibration signals corresponding to the transmit channels in the phased array antenna includes: calculating the difference between the amplitudes of the calibration signals corresponding to the transmit channels in the phased array antenna, and compensating for, in the transmit channels by using an attenuator, the amplitudes of the calibration signals corresponding to the transmit channels, so that the calibration signals corresponding to the transmit channels have equal amplitudes. In this embodiment of this application, the amplitudes of the calibration signals corresponding to the transmit channels may be compensated for in the transmit channels by using the attenuator. The operation is simple, and applicability is higher.

With reference to the first aspect, in a possible implementation, compensating for phases of the transmit channels based on a difference between phases of the calibration signals corresponding to the transmit channels in the phased array antenna includes: calculating the difference between the phases of the calibration signals corresponding to the transmit channels in the phased array antenna, and compensating for, in the transmit channels by using a phase shifter, the phases of the calibration signals corresponding to the transmit channels, so that the calibration signals corresponding to the transmit channels have equal phases. In this embodiment of this application, the phases of the calibration signals corresponding to the transmit channels may be compensated for in the transmit channels by using the phase shifter. The operation is simple, implementation difficulty is low, and applicability is higher.

With reference to the first aspect, in a possible implementation, a calibration antenna element corresponding to any antenna subarray in the phased array antenna is deployed at a central position or a peripheral edge of all service antenna elements included in the antenna subarray. In this way, the calibration antenna element can better cover the service antenna elements in the antenna subarray, thereby improving calibration reliability of the phased array antenna.

With reference to the first aspect, in a possible implementation, the calibration antenna elements in the phased array antenna include a monopole antenna element, a slotted waveguide antenna element, and/or another antenna element whose radiation direction is orthogonal to a radiation direction of a service antenna element in the phased array antenna. In this embodiment of this application, the calibration antenna element is implemented in many manners, to improve implementation flexibility of the method for calibrating a phased array antenna provided in this embodiment of this application, so that an application range is wider.

According to a second aspect, an embodiment of this application provides a method for calibrating a phased array antenna. A phased array antenna to which the method is applicable includes a plurality of service antenna elements and a plurality of calibration antenna elements that are deployed independently of the plurality of service antenna elements, the plurality of service antenna elements are grouped into a plurality of antenna subarrays based on the plurality of calibration antenna elements, and one calibration antenna element corresponds to one antenna subarray. In the method, an amplitude and/or a phase of a calibration signal corresponding to any receive channel (for example, a receive channel i) in the phased array antenna may be obtained by performing the following step 1 to step 3:

step 1: determining N groups of relative positions of a service antenna element (for example, a service antenna element i) corresponding to the receive channel i and N calibration antenna elements in the phased array antenna, where N is greater than or equal to 2 and is less than or equal to a total quantity of calibration antenna elements in the phased array antenna;

step 2: separately performing, based on the N groups of relative positions, delay weighting on N test signals fed into the N calibration antenna elements, to obtain N calibration signals, where the N calibration signals are radiated by the N calibration antenna elements and are received by the service antenna element in the phased array antenna; and step 3: receiving the N calibration signals by using the service antenna element i, combining the N calibration signals into one time-domain aligned calibration signal, and recording an amplitude and/or a phase of the time-domain aligned calibration signal, to obtain the amplitude and/or the phase of the calibration signal corresponding to the receive channel i.

The foregoing step 1 to step 3 are repeatedly performed to obtain amplitudes and/or phases of calibration signals corresponding to all receive channels in the phased array antenna. The amplitudes and/or the phases of the calibration signals corresponding to the receive channels are compensated for based on a difference between the amplitudes and/or the phases of the calibration signals corresponding to the receive channels in the phased array antenna, so that the receive channels in the phased array antenna have equal amplitudes and/or phases.

In this embodiment of this application, the amplitudes and/or the phases of the receive channels in the phased array antenna are compensated for, so that the receive channels in the phased array antenna have equal amplitudes and/or phases. In this way, an optimal signal-to-noise ratio of a signal radiated by the phased array antenna can be ensured, and performance of the phased array antenna can be guaranteed. Implementation complexity is low, and applicability is higher. In this embodiment of this application, a plurality of calibration antenna elements jointly transmit a calibration signal to a service antenna element corresponding to each receive channel, so that the service antenna element corresponding to each receive channel can receive a strongest calibration signal corresponding to each receive channel. Further, the amplitudes and/or the phases of the receive channels in the phased array antenna are compensated for, so that the receive channels in the phased array antenna have equal amplitudes and/or phases. In this way, the phased array antenna can receive a strongest signal, and performance of the phased array antenna can be guaranteed. Implementation complexity is low, and applicability is higher.

With reference to the second aspect, in a possible implementation, before the determining N groups of relative positions of a service antenna element i corresponding to the receive channel i and N calibration antenna elements in the phased array antenna, the method further includes: determining a distance between the service antenna element i and a calibration antenna element i corresponding to an antenna subarray to which the service antenna element i belongs; when the distance between the service antenna element i and the calibration antenna element i is greater than or equal to a preset distance threshold, obtaining a coupling signal between the service antenna element i and the calibration antenna element i; and determining, in the calibration antenna elements included in the phased array antenna, N–1 calibration antenna elements other than the calibration antenna element i based on a signal-to-noise ratio of the coupling signal between the service antenna element i and the calibration antenna element i, to obtain the N calibration antenna elements that include the calibration antenna element i, where the N calibration antenna elements are coupled to the service antenna element i at time points to $t_0$ $t_{N-1}$ respectively.

In this embodiment of this application, different signal processing policies include that receive channels corresponding to service antenna elements in different positions may be calibrated by using different quantities of calibration antenna elements, to control, for the service antenna elements in the different positions, beams that point to different directions in antenna patterns, so that a service antenna element in each position can receive a strongest signal. Optionally, a receive channel corresponding to a service antenna element that is relatively close to a calibration antenna element may be calibrated by using the single calibration antenna element by sending and/or receiving a signal. Because a coupling degree between a service antenna element and a calibration antenna element decreases as a distance between the two antenna elements increases, a receive channel corresponding to a service antenna element that is relatively far away from a calibration antenna element may be calibrated by using a plurality of calibration antenna elements by sending and/or receiving signals.

With reference to the second aspect, in a possible implementation, compensating for the amplitudes of the calibration signals corresponding to the receive channels, based on a difference between the amplitudes of the calibration signals corresponding to the receive channels in the phased array antenna includes: calculating the difference between the amplitudes of the calibration signals corresponding to the receive channels in the phased array antenna, and compensating for, in the receive channels by using an attenuator, the amplitudes of the calibration signals corresponding to the receive channels, so that the calibration signals corresponding to the receive channels have equal amplitudes. The operation is simple, and the phased array antenna has high applicability.

With reference to the second aspect, in a possible implementation, compensating for the phases of the calibration signals corresponding to the receive channels, based on a difference between the phases of the calibration signals corresponding to the receive channels in the phased array antenna includes: calculating the difference between the phases of the calibration signals corresponding to the receive channels in the phased array antenna, and compensating for, in the receive channels by using a phase shifter, the phases of the calibration signals corresponding to the receive channels, so that the calibration signals corresponding to the receive channels have equal phases. The phased array antenna is easy to implement and has a wider application range.

With reference to the second aspect, in a possible implementation, a calibration antenna element corresponding to any antenna subarray in the phased array antenna is deployed in a central position or at a peripheral edge of all service antenna elements included in the antenna subarray.

With reference to the second aspect, in a possible implementation, the calibration antenna elements in the phased array antenna include a monopole antenna element, a slotted waveguide antenna element, and/or another antenna element whose radiation direction is orthogonal to a radiation direction of a service antenna element in the phased array antenna.

According to a third aspect, an embodiment of this application provides a terminal. The terminal includes a phased array antenna, and the terminal further includes units and/or modules configured to perform the method for calibrating a phased array antenna provided in any one of the first aspect and/or the possible implementations of the first aspect. Therefore, beneficial effects (or advantages) of the method provided in any one of the first aspect and/or the possible implementations of the first aspect can also be achieved.

According to a fourth aspect, an embodiment of this application provides a terminal. The terminal includes a phased array antenna, and the terminal further includes units and/or modules configured to perform the method for calibrating a phased array antenna provided in any one of the second aspect and/or the possible implementations of the second aspect. Therefore, beneficial effects (or advantages) of the method provided in any one of the second aspect and/or the possible implementations of the second aspect can also be achieved.

According to a fifth aspect, an embodiment of this application provides a terminal. The terminal includes a phased array antenna, and the terminal further includes a memory and a signal processor. The memory and the signal processor are connected by using a bus system. The memory is configured to store a group of program code. The signal processor is configured to invoke the program code stored in the memory, to perform the method for calibrating a phased array antenna provided in any one of the first aspect and/or the possible implementations of the first aspect. Therefore, beneficial effects (or advantages) of the method provided in any one of the first aspect and/or the possible implementations of the first aspect can also be achieved.

According to a sixth aspect, an embodiment of this application provides a terminal. The terminal includes a phased array antenna, and the terminal further includes a memory and a signal processor. The memory and the signal processor are connected by using a bus system. The memory is configured to store a group of program code. The signal processor is configured to invoke the program code stored in the memory, to perform the method for calibrating a phased array antenna provided in any one of the second aspect and/or the possible implementations of the second aspect. Therefore, beneficial effects (or advantages) of the method provided in any one of the second aspect and/or the possible implementations of the second aspect can also be achieved.

According to a seventh aspect, an embodiment of this application provides a computer-readable storage medium. The computer-readable storage medium stores an instruction, and when the instruction is run on a terminal, the terminal is enabled to perform the method for calibrating a phased array antenna provided in any one of the first aspect and/or the possible implementations of the first aspect. Therefore, beneficial effects (or advantages) of the method provided in any one of the first aspect and/or the possible implementations of the first aspect can be achieved.

According to an eighth aspect, an embodiment of this application provides a computer-readable storage medium. The computer-readable storage medium stores an instruction, and when the instruction is run on a terminal, the terminal is enabled to perform the method for calibrating a phased array antenna provided in any one of the second aspect and/or the possible implementations of the second aspect. Therefore, beneficial effects (or advantages) of the method provided in any one of the second aspect and/or the possible implementations of the second aspect can also be achieved.

According to a ninth aspect, an embodiment of this application provides a terminal. The terminal may be a chip or a plurality of chips that work cooperatively. The terminal includes a phased array antenna coupled to the terminal (for example, a chip). The terminal is configured to perform the method for calibrating a phased array antenna provided in any one of the first aspect and/or the possible implementations of the first aspect, and/or provided in any one of the second aspect and/or the possible implementations of the second aspect. It should be understood that, "coupling" herein means that two components are directly or indirectly combined with each other. Such combination may be fixed or mobile, and such combination may allow communication of fluid, electricity, an electrical signal, or another type of signal between the two components.

According to a tenth aspect, an embodiment of this application provides a computer program product including an instruction. When the computer program product is run on a terminal, the terminal is enabled to perform the method for calibrating a phased array antenna provided in any one of the first aspect and/or the possible implementations of the first aspect, and/or provided in any one of the second aspect and/or the possible implementations of the second aspect. In addition, beneficial effects of the method provided in either the first aspect or the second aspect can also be achieved.

DESCRIPTION OF EMBODIMENTS

In a phased array antenna, a shape of an antenna pattern is changed by controlling an amplitude and a phase of a feed of a radiation element in an array antenna. An amplitude and a phase of each radiation element in the array antenna is controlled to change a direction in which the strength of radiation in the antenna pattern of the phased array antenna has a maximum value to scan a beam. The radiation element in the array antenna of the phased array antenna herein refers to an antenna element or a service antenna element in the array antenna. For ease of description, the following uses the service antenna element as an example for description. The array antenna herein refers to service antenna elements deployed in a form of an array in the phased array antenna. In other words, service antenna elements in the phased array antenna form an array. The array may be referred to as an antenna array, and these service antenna elements in the array are also referred to as an array antenna.

Embodiments of this application provide a method for calibrating a phased array antenna and a related apparatus. A plurality of calibration antenna elements may be deployed in an antenna array formed by service antenna elements in the phased array antenna, and the plurality of calibration antenna elements are independent of the service antenna elements, and antenna channels in the phased array antenna are calibrated online based on coupling between the plurality of calibration antenna elements and the service antenna elements. The antenna channels in the phased array antenna include a transmit channel and a receive channel in the phased array antenna. The following separately describes online calibration of the transmit channel and the receive channel in the phased array antenna with reference to deployment of the calibration antenna elements in the phased array antenna provided in the embodiments of this application. This is not limited herein.

Figure 1:
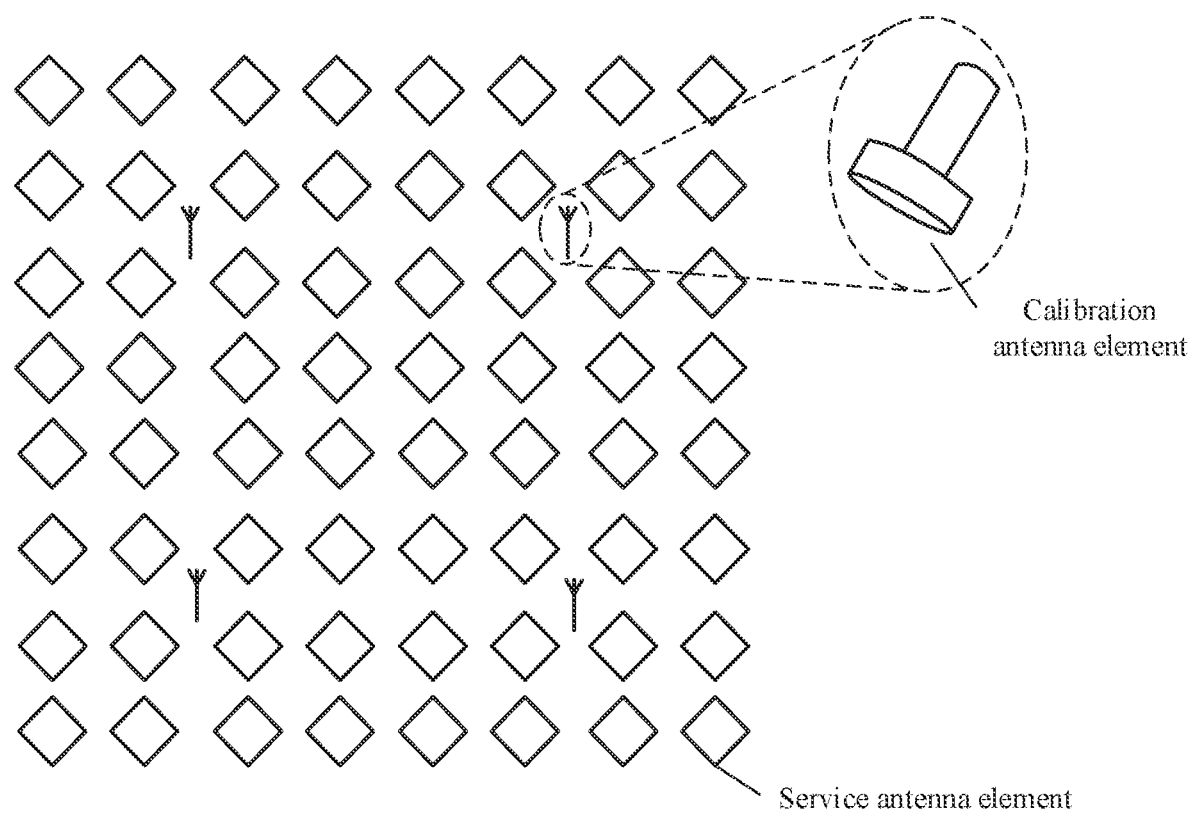
FIG. 1 is a schematic distribution diagram of antenna elements according to an embodiment of this application.

FIG. 1 is a schematic distribution diagram of antenna elements according to an embodiment of this application. In the schematic distribution diagram of the antenna elements shown in FIG. 1, the antenna elements include a service antenna element and a calibration antenna element. As shown in FIG. 1, a square represents a service antenna element, and a calibration antenna element in a phased array antenna is deployed, in an antenna array of the phased array antenna, independently of the service antenna element. Herein, that the calibration antenna element is deployed independently of the service antenna element means that a deployment position of the calibration antenna element in the phased array antenna does not affect a deployment position of the service antenna element in the antenna array of the phased array antenna. In other words, in this embodiment of this application, a deployment position of each service antenna element in the antenna array of the phased array antenna is not limited, and calibration antenna elements in the phased array antenna are distributed among the service antenna elements on a basis of deployment of the service antenna elements. In other words, in this embodiment of this application, the manner of deploying a calibration antenna element of the phased array antenna is applicable to a phased array antenna with any service antenna element deployment manner. Therefore, an application range of the method for calibrating a phased array antenna provided in the embodiment in this application is enlarged, and flexibility of the method is stronger.

Figure 2:
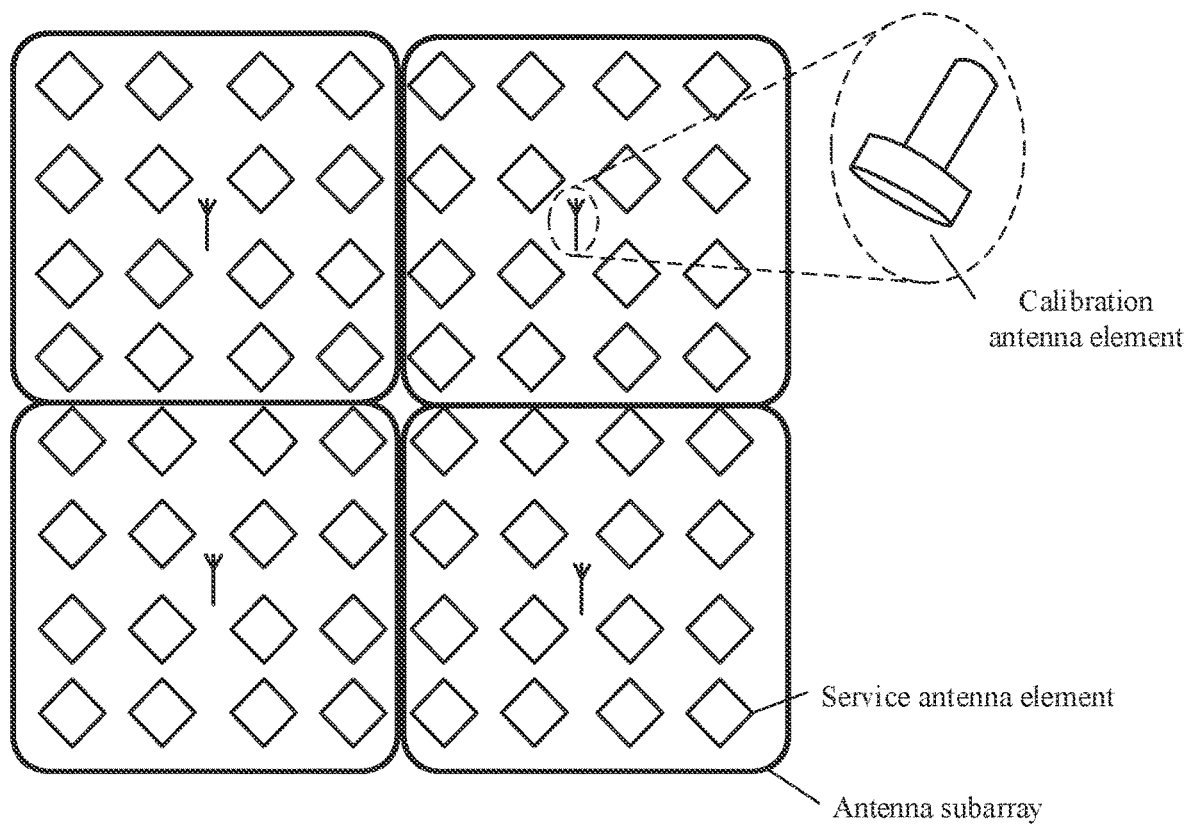
FIG. 2 is a schematic diagram of an antenna subarray according to an embodiment of this application.

Optionally, in some feasible implementations, at least two (that is, a plurality of) calibration antenna elements are deployed in the antenna array of the phased array antenna, an antenna array formed by service antenna elements in the phased array antenna may be grouped into a plurality of antenna subarrays based on the plurality of calibration antenna elements. That is, the antenna array of the phased array antenna may be divided into at least two antenna subarrays based on the calibration antenna elements. One antenna subarray includes one calibration antenna element and a plurality of service antenna elements, and each calibration antenna element may be located at a center or a periphery edge of an antenna subarray to which the calibration antenna element belongs. FIG. 2 is a schematic diagram of an antenna subarray according to an embodiment of this application. As shown in FIG. 2, in each antenna subarray of a phased array antenna, a calibration antenna element may be located in the middle of all service antenna elements of the antenna subarray. That is, service antenna elements surrounding a same calibration antenna element are grouped into a same antenna subarray. In other words, during division of the antenna array of the phased array antenna, each calibration antenna element may be used as a center, and service antenna elements surrounding a same calibration antenna element are grouped into a same antenna subarray. Further, the antenna array of the phased array antenna may be divided into a plurality of antenna subarrays. As shown in FIG. 2, one rounded square represents one antenna subarray. A shape of an antenna subarray obtained through division by using each calibration antenna element as a center may alternatively be another shape other than a rounded square. This is not limited herein.

Optionally, in some optional implementations, the calibration antenna element may alternatively be located at a periphery edge of the antenna subarray. That is, the calibration antenna element may be located at an edge of an outer side of all service antenna elements in the antenna subarray. For example, the calibration antenna element may be located in a position such as an upper left corner, an upper right corner, or a lower right corner in the antenna subarray shown in a rounded rectangle shown in FIG. 2. This may be specifically determined based on an actual application scenario, and is not limited herein. In other words, in the antenna array of the phased array antenna, division into antenna subarrays may be performed according to a rule that one calibration antenna element corresponds to one antenna subarray. A specific area that is obtained through division and in which service antenna elements are located may be determined based on an actual application scenario, and is not limited herein. For example, a position of a calibration antenna element may be used as a reference, service antenna elements distributed in an area in which the calibration antenna element is located are grouped into a same antenna subarray, and coverage of the service antenna elements in the antenna subarray is implemented by using the calibration antenna element. In this way, a coupling degree between a calibration antenna element and each service antenna element in each antenna subarray can be improved, and performance stability of the phased array antenna can be better guaranteed.

Optionally, in this embodiment of this application, the calibration antenna element includes but is not limited to a monopole antenna element, a slotted waveguide antenna element, and/or another antenna element whose radiation direction is orthogonal to a radiation direction of a service antenna element in the phased array antenna. In specific implementation, an implementation form of the calibration antenna element may be determined based on an actual application scenario, and is not limited herein.

In some feasible implementations, the calibration of the phased array antenna may include calibration of a transmit channel and calibration of a receive channel in the phased array antenna. With reference to FIG. 3 to FIG. 11, using the antenna subarray division scenario shown in FIG. 2 as an example, the following describes, respectively by using Embodiment 1 and Embodiment 2, calibration of a transmit channel and calibration of a receive channel in a method for calibrating a phased array antenna and a related apparatus provided in the embodiments of this application.

Embodiment 1: Calibration of a Transmit Channel

Figure 3:
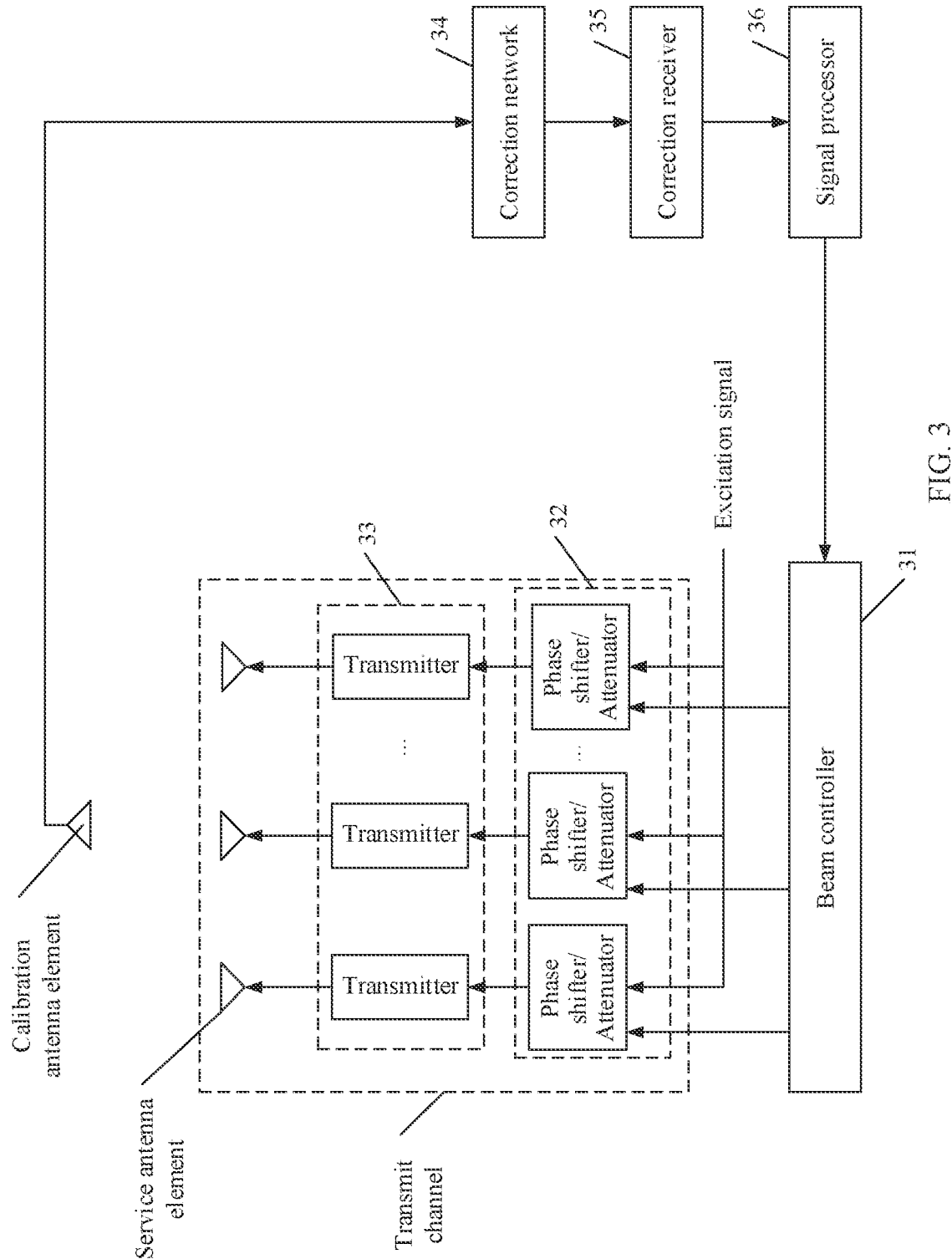
FIG. 3 is a schematic structural diagram of a system for calibrating a transmit channel in a phased array antenna according to an embodiment of this application.

FIG. 3 is a schematic structural diagram of a system for calibrating a transmit channel in a phased array antenna according to an embodiment of this application. The system for calibrating a transmit channel in a phased array antenna provided in this embodiment of this application includes but is not limited to a beam controller 31, a plurality of phase shifters/attenuators (that is, phase shifters and/or attenuators) 32, a plurality of transmitters 33, a correction network 34, a correction receiver 35, and a signal processor 36. The calibration system shown in FIG. 3 may include one or more transmit channels. One transmit channel may include one phase shifter/attenuator, one transmitter, and one service antenna element.

In some feasible implementations, a process of calibrating a transmit channel in a phased array antenna may include the following steps:

(1) An excitation signal (for example, an enabling signal used for calibrating the transmit channel, or referred to as a test signal) for calibrating the transmit channel is fed into a phase shifter/an attenuator 32 for phase and/or amplitude adjustment, then is transmitted to a service antenna element via a transmitter 33, and finally is radiated into space via the service antenna element. A calibration antenna element receives the signal, and the correction network 34 synthesizes the signal into a radio frequency signal.

(2) The correction receiver 35 receives and processes the radio frequency signal obtained after the synthetization by the correction network 34, and outputs data including a phase and/or an amplitude.

(3) The signal processor 36 performs inversion calculation on the data that is output by the correction receiver 35 and that includes the phase and/or the amplitude, to obtain an amplitude and/or a phase of the transmit channel.

(4) If amplitudes and/or phases of the transmit channels are equal, or a difference between amplitudes and/or phases of the transmit channels are less than or equal to a specified threshold, correction on the transmit channels ends. If the difference between the amplitudes and/or the phases of the transmit channels are greater than the specified threshold, the signal processor 36 compensates for the difference between the amplitudes and/or the phases of the transmit channels, so that the amplitudes and/or the phases of all the transmit channels are equal or the difference between the amplitudes and/or the phases of the transmit channels is less than or equal to the specified threshold. The signal processor 36 feeds back an amplitude and/or a phase that are/is of each transmit channel and that are/is obtained after the compensation to the beam controller 31.

(5) The beam controller 31 controls the phase shifter/the attenuator 32 at a high speed by using a group of control signals for calibrating the transmit channel, and adjusts the phase and/or the amplitude of each transmit channel based on each phase shifter/attenuator 32, so that the phases and/or the amplitudes of all the transmit channels are equal or the difference between the phases and/or the amplitudes of the transmit channels is less than or equal to the specified threshold.

A method for calibrating a phased array antenna provided in this embodiment of this application may be applicable to a terminal that includes a phased array antenna and the calibration system that is shown in FIG. 3. The method for calibrating a phased array antenna may be performed by the signal processor 36 in the calibration system shown in FIG. 3, or may be performed by other more signal processing units included in the terminal. This is not limited herein. The signal processor 36 and/or the another signal processing unit process/processes a signal transmitted through each transmit channel to obtain an optimal calibration signal corresponding to each transmit channel, and further, may compensate for an amplitude and/or a phase of a calibration signal corresponding to each transmit channel, so that the transmit channels in the phased array antenna have equal amplitudes and/or phases.

Figure 4:
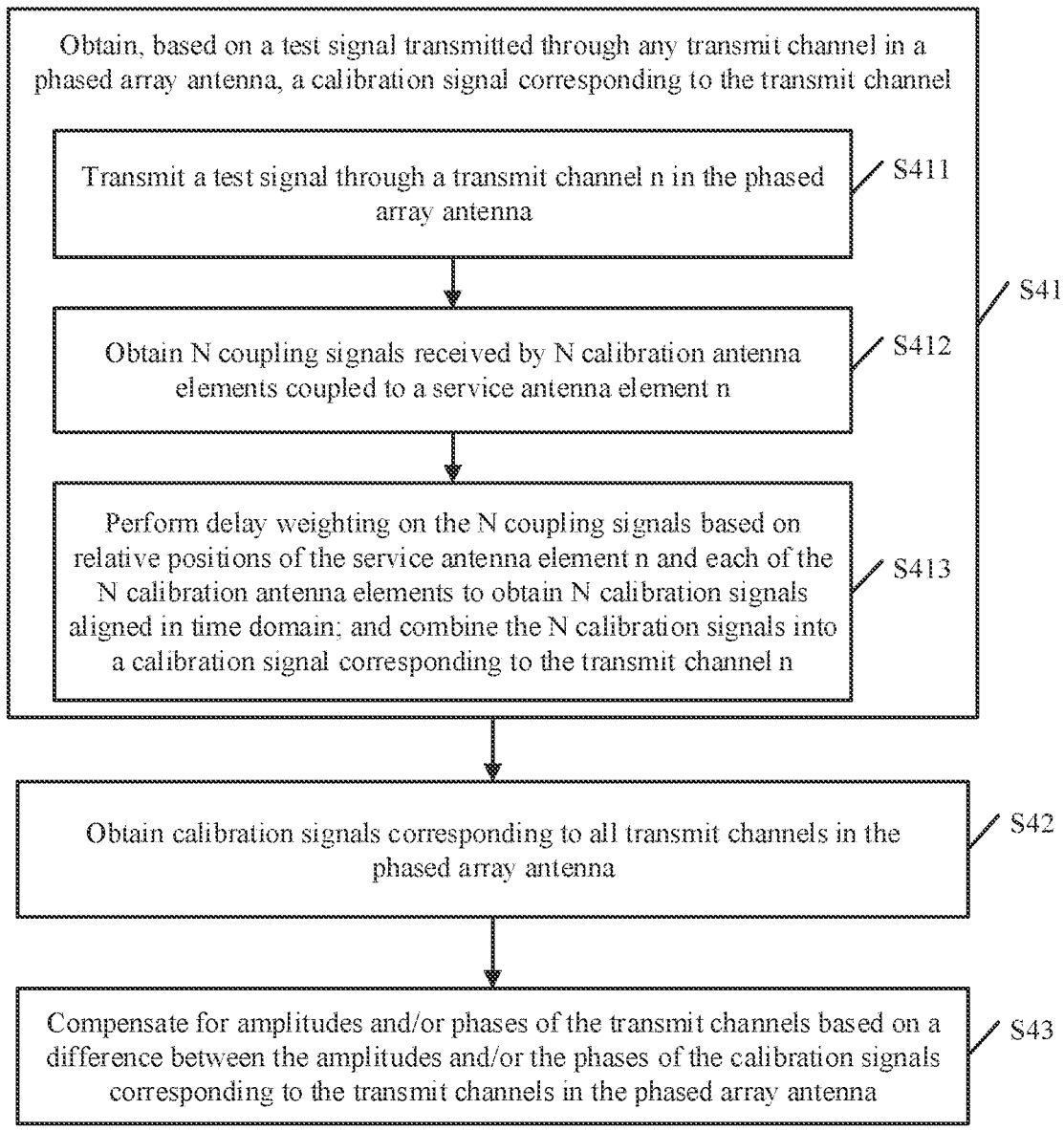
FIG. 4 is a schematic flowchart of a method for calibrating a phased array antenna according to an embodiment of this application.

FIG. 4 is a schematic flowchart of a method for calibrating a phased array antenna according to an embodiment of this application. The method for calibrating a phased array antenna shown in FIG. 4 is applicable to calibration of a transmit channel in the phased array antenna, and may include the following steps.

S41. Obtain, based on a test signal transmitted through any transmit channel in the phased array antenna, a calibration signal corresponding to the transmit channel.

In some feasible implementations, to calibrate each transmit channel in the phased array antenna, one test signal may be first transmitted through each transmit channel. The test signal transmitted by each transmit channel is radiated by a service antenna element corresponding to the transmit channel, and is received by one or more calibration antenna elements in the phased array antenna. A test signal that corresponds to any transmit channel and that is received by the one or more calibration antenna elements in the phased array antenna may be processed to obtain a calibration signal corresponding to the transmit channel. The test signal transmitted through the transmit channel is a signal used to calibrate the transmit channel. For ease of description, the following uses a test signal as an example for description. For ease of description, an example in which any transmit channel in the phased array antenna may be a transmit channel n is used for description, where n is an integer greater than zero and less than a total quantity (which, for ease of description, may be set to M) of transmit channels in the phased array antenna. Correspondingly, that the test signal transmitted through the transmit channel n may be a test signal dn is used as an example for description.

In some feasible implementations, the calibration signal corresponding to the transmit channel in the phased array antenna may be obtained through processing in implementations provided in the following steps S411 to S413.

S411. Transmit a test signal through the transmit channel n in the phased array antenna.

In some feasible implementations, the test signal dn transmitted through the transmit channel n may be radiated by a service antenna element corresponding to the transmit channel n, and received by the one or more calibration antenna elements in the phased array antenna. For ease of description, an example in which the service antenna element corresponding to the transmit channel n may be a service antenna element n is used for description.

S412. Obtain N coupling signals received by N calibration antenna elements coupled to the service antenna element n.

In some feasible implementations, in the phased array antenna, a calibration antenna element coupled to the service antenna element n may be a part or all of the plurality of calibration antenna elements included in the phased array antenna, and includes at least a calibration antenna element (for ease of description, a calibration antenna element n may be used as an example for description) corresponding to an antenna subarray to which the service antenna element n belongs. It is assumed that the service antenna element n is one of service antenna elements included in an antenna subarray 1 in the phased array antenna, and a calibration antenna element in the antenna subarray 1 is the calibration antenna element n. Optionally, the test signal dn radiated by the service antenna element n may be received by one or more calibration antenna elements including the calibration antenna element n, and may be determined, based on a relative position relationship between the service antenna element n and the calibration antenna element n, to be processed by using a corresponding signal processing policy, to obtain a calibration signal corresponding to the transmit channel n.

In some feasible implementations, in signal processing policies, transmit channels corresponding to service antenna elements in different positions may be calibrated by using different quantities of calibration antenna elements, to control, for the service antenna elements in the different positions, beams that point to different directions in antenna patterns, thereby obtaining an optimal signal-to-noise ratio of a signal radiated by a service antenna element in each position. Optionally, a transmit channel corresponding to a service antenna element that is relatively close to a calibration antenna element may be calibrated by using the single calibration antenna element by sending and/or receiving a signal. Because a coupling degree between a service antenna element and a calibration antenna element decreases as a distance between the two antenna elements increases, a transmit channel corresponding to a service antenna element that is relatively far away from a calibration antenna element may be calibrated by using a plurality of calibration antenna elements by sending and/or receiving signals. For example, to calibrate the transmit channel n, if a distance between the service antenna element n and the calibration antenna element n is greater than or equal to a preset distance threshold, a plurality of calibration antenna elements including the calibration antenna element n may be used to jointly calibrate the transmit channel n. The preset distance threshold may be determined based on a requirement in an actual application scenario. For example, the preset distance threshold is determined based on a signal-to-noise ratio requirement for calibrating a channel in an actual application scenario. This is not limited herein. If the distance between the service antenna element n and the calibration antenna element n is less than the preset distance threshold, the calibration antenna element n may be used to calibrate the transmit channel n, to satisfy a signal-to-noise ratio requirement for calibrating the transmit channel. Optionally, to improve precision of calibrating the transmit channel n, when the distance between the service antenna element n and the calibration antenna element n is less than the preset distance threshold, alternatively, a plurality of calibration antenna elements including the calibration antenna element n may be used to jointly calibrate the transmit channel n. This may be specifically determined based on an actual application scenario, and is not limited herein. The following provides descriptions by using an example in which a plurality of calibration antenna elements including the calibration antenna element n are used to jointly calibrate the transmit channel n. In other words, a plurality of calibration antenna elements selected for calibrating any transmit channel include at least a calibration antenna element in an antenna subarray to which a service antenna element corresponding to the transmit channel belongs. Details are not further described below. For ease of description, for example, the plurality of calibration antenna elements may be N calibration antenna elements, where N is greater than or equal to 2 and is less than or equal to a total quantity of calibration antenna elements in the phased array antenna.

In some feasible implementations, a coupling signal (correspondingly, the coupling signal is a first coupling signal, and may be set as a coupling signal n for ease of description) between the service antenna element n and the calibration antenna element n may be obtained. Further, N−1 calibration antenna elements other than the calibration antenna element n may be determined, based on a signal-to-noise ratio of the coupling signal n, in the calibration antenna elements coupled to the service antenna element n in the phased array antenna. Optionally, a quantity (that is, N in N−1) of calibration antenna elements and positions of the calibration antenna elements may be determined and selected based on a signal-to-noise ratio of the coupling signal n in combination with a signal-to-noise ratio requirement for receiving a strongest coupling signal by the calibration antenna element in the phased array antenna and a position of each calibration antenna element in the phased array antenna, so that each calibration antenna element can receive a strongest coupling signal. This is not limited herein. The N calibration antenna elements including the calibration antenna element n may be coupled to the service antenna element n at time points $t_0$ to $t_{n=N-1}$ respectively. The time points $t_0$ to $t_{n=N-1}$ are evenly distributed, and time intervals each are less than half a bandwidth for transmitting a signal through the transmit channel n. After the test signal dn transmitted through the transmit channel n is radiated by the service antenna element n, the test signal dn may be received by the N calibration antenna elements coupled to the service antenna element n, to obtain the N coupling signals received by the N calibration antenna elements. For ease of description, the obtained N coupling signals may be denoted as $A_0$ to $A_{n=N-1}$.

S413. Perform delay weighting on the N coupling signals based on relative positions of the service antenna element n and each of the N calibration antenna elements to obtain N calibration signals aligned in time domain; and combine the N calibration signals into the calibration signal corresponding to the transmit channel n.

In some feasible implementations, the test signal transmitted through the transmit channel n is received by the N calibration antenna elements coupled to the service antenna element n, and distances between the calibration antenna elements and the service antenna element n are different. Therefore, each calibration antenna element has a different delay in receiving the signal radiated by the service antenna element n. Therefore, after the N calibration antenna elements including the calibration antenna element n receive the N coupling signals $A_0$ to $A_{n=N-1}$, delay weighting may be performed on the N coupling signals $A_0$ to $A_{n=N-1}$ based on the relative positions of each of the calibration antenna elements and the service antenna element n, to obtain N signals aligned in time domain. For ease of description, the N signals that are aligned in time domain and that are obtained by performing delay weighting on the N coupling signals $A_0$ to $A_{n=N-1}$ may be described by using the N calibration signals as an example. After the N calibration signals aligned in time domain are obtained through the delay weighting, the N calibration signals may be combined into one calibration signal, so that the calibration signal obtained through the combination may be determined as the calibration signal corresponding to the transmit channel n.

Figure 5:
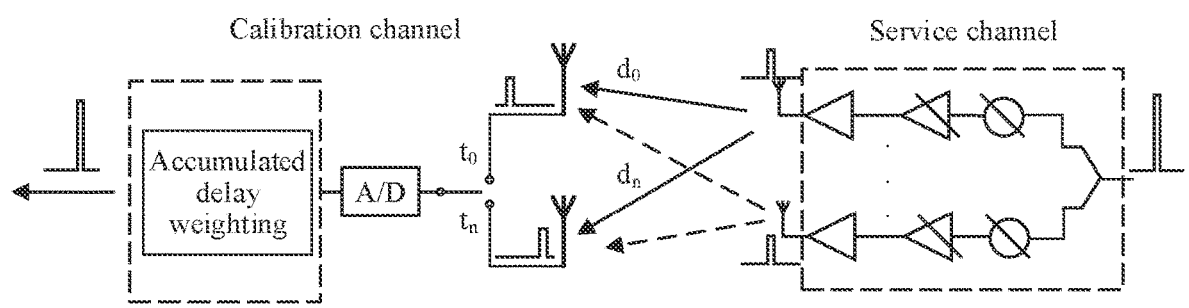
FIG. 5 is a schematic diagram of signal processing for calibrating a transmit channel according to an embodiment of this application.

FIG. 5 is a schematic diagram of signal processing for calibrating a transmit channel according to an embodiment of this application. As shown in FIG. 5, a test signal transmitted through each transmit channel in the phased array antenna may be first radiated by a service antenna element corresponding to a service channel, and then received, at different time points (to to $t_n$ (that is, $t_{n=N-1}$)) by calibration antenna elements coupled to the service antenna element. One transmit channel in the service channel corresponds to one service antenna element, and a signal transmitted through one service antenna element may be received by a plurality of calibration antenna elements. As shown in FIG. 5, in a process of calibrating each transmit channel in the phased array antenna, all calibration antenna elements share a same calibration channel, and on the calibration channel, coupling signals for coupling between different calibration antenna elements and service antenna elements may be obtained through switching by using a switch. Therefore, an extra calibration error caused by different calibration channels can be avoided, and impact of different calibration channels on precision of calibrating each transmit channel can be avoided, thereby improving precision of calibrating a transmit channel in the phased array antenna.

For the transmit channel n, as shown in FIG. 5, after each coupling signal received by each calibration antenna element is obtained on the calibration channel, each coupling signal may be first converted from an analog signal into a digital signal through A/D conversion (that is, analog-to-digital conversion). That is, analog signals received by the calibration antenna elements may be converted into digital signals through the A/D conversion, and then delay weighting may be performed, in digital domain, on the N digital signals obtained through the A/D conversion, to obtain the N calibration signals. The N calibration signals may be combined into one calibration signal through signal superposition (that is, amplitude superposition and enhancement), to obtain the calibration signal corresponding to the transmit channel n. After the test signal transmitted through each transmit channel is received by each calibration antenna element, delay weighting processing may be performed on the coupling signals received by the calibration antenna elements, and the coupling signals may be combined into one calibration signal, to obtain one calibration signal corresponding to one transmit channel. Therefore, an amplitude and/or a phase of each transmit channel may be compensated for based on the calibration signal corresponding to each transmit channel.

S42. Obtain calibration signals corresponding to all transmit channels in the phased array antenna.

In some feasible implementations, a calibration signal corresponding to each transmit channel in the phased array antenna may be obtained based on the implementations provided in the foregoing steps S411 to S413. Therefore, the calibration signals corresponding to all the transmit channels in the phased array antenna can be obtained. For details, refer to the implementations provided in the foregoing steps S411 to S413. Details are not described herein again.

S43. Compensate for amplitudes and/or phases of the transmit channels based on a difference between the amplitudes and/or the phases of the calibration signals corresponding to the transmit channels in the phased array antenna, so that the transmit channels in the phased array antenna have equal amplitudes and/or phases.

In some feasible implementations, after the calibration signals corresponding to the transmit channels are obtained, the difference between the amplitudes of the calibration signals corresponding to the transmit channels may be calculated based on the obtained amplitudes of the calibration signals corresponding to the transmit channels. Optionally, to calculate the difference between the amplitudes of the calibration signals corresponding to the transmit channels, an amplitude of one of the transmit channels may be used as a reference amplitude, and then a difference between the reference amplitude and an amplitude of each of the other transmit channels may be calculated, to compensate for an amplitude, in each transmit channel by using an attenuator, of a calibration signal corresponding to the transmit channel, so that the calibration signals corresponding to the transmit channels have equal amplitudes. Optionally, the amplitude of the calibration signal corresponding to each transmit channel is compensated in each transmit channel by using the attenuator, so that the amplitudes of the calibration signals corresponding to all the transmit channels are equal to the reference amplitude. In this way, the amplitudes of all the transmit channels in the phased array antenna are the same.

In some feasible implementations, after the calibration signals corresponding to the transmit channels are obtained, the difference between the phases of the calibration signals corresponding to the transmit channels may further be calculated based on the obtained phases of the calibration signals corresponding to the transmit channels. Optionally, to calculate the difference between the phases of the calibration signals corresponding to the transmit channels, a phase of one of the transmit channels may be used as a reference phase, and then a difference between the reference phase and a phase of each of the other transmit channels may be calculated, to compensate for a phase, in each transmit channel by using a phase shifter, of a calibration signal corresponding to the transmit channel, so that the calibration signals corresponding to the transmit channels have equal phases. Optionally, the phase of the calibration signal corresponding to each transmit channel is compensated in each transmit channel by using the phase shifter, so that the phases of the calibration signals corresponding to all the transmit channels are equal to the reference phase. In this way, the phases of all the transmit channels in the phased array antenna are the same.

In this embodiment of this application, the amplitudes and/or the phases of the transmit channels in the phased array antenna are compensated for, so that the transmit channels in the phased array antenna have equal amplitudes and/or phases. In this way, an optimal signal-to-noise ratio of a signal radiated by the phased array antenna can be ensured, and performance of the phased array antenna can be guaranteed. Implementation complexity is low, and applicability is higher.

Embodiment 2: Calibration of a Receive Channel

Figure 6:
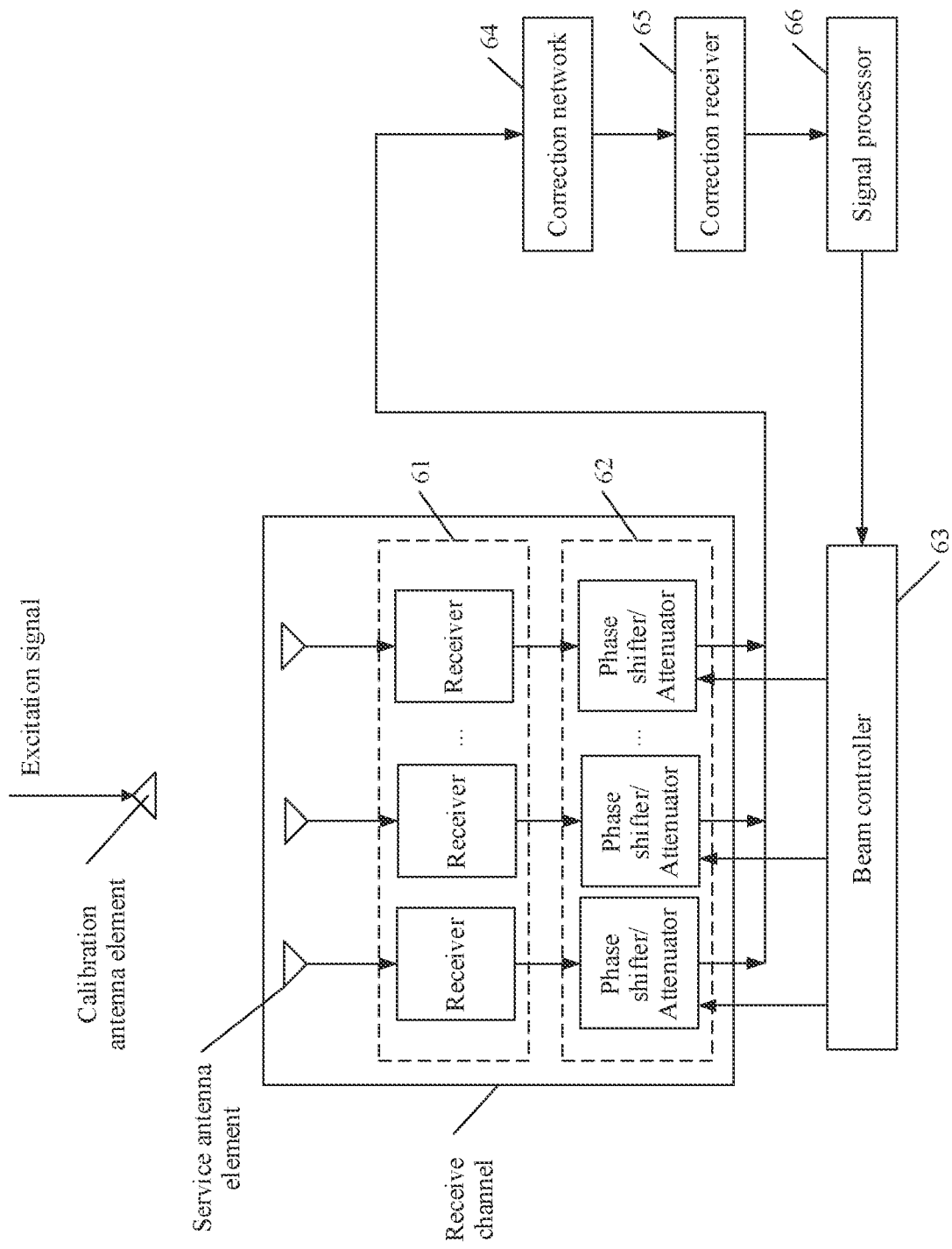
FIG. 6 is a schematic structural diagram of a system for calibrating a receive channel in a phased array antenna according to an embodiment of this application.

FIG. 6 is a schematic structural diagram of a system for calibrating a receive channel in a phased array antenna according to an embodiment of this application. The system for calibrating a receive channel in a phased array antenna provided in this embodiment of this application includes but is not limited to a plurality of receivers 61, a plurality of phase shifters/attenuators (that is, phase shifters and/or attenuators) 62, a beam controller 63, a correction network 64, a correction receiver 65, and a signal processor 66. The calibration system shown in FIG. 6 may include one or more receive channels. One receive channel may include one service antenna element, one phase shifter/attenuator, and one receiver.

In some feasible implementations, a process of calibrating a receive channel in a phased array antenna may include the following steps:

(1) An excitation signal (that is, a test signal for calibrating the receive channel) for calibrating the receive channel may be transmitted based on a calibration antenna element, and received by a service antenna element in the phased array antenna.

(2) After the excitation signal received by the service antenna element passes through a receive channel corresponding to the service antenna element, the correction network 64 synthesizes the excitation signal into a radio frequency signal. The receive channel corresponding to the service antenna element includes a receiver 61 and a phase shifter/an attenuator 62. The excitation signal received by the service antenna element passes through the receiver in the receive channel, is output to the correction network 64 after a phase and/or an amplitude of the signal is adjusted by using a phase shifter/attenuator 62, and is synthesized into the radio frequency signal by the correction network 64.

(3) The correction receiver 65 receives and processes the radio frequency signal obtained after the synthetization by the correction network 64, and outputs data including a phase and/or an amplitude.

(4) The signal processor 66 performs inversion calculation on the data that is output by the correction receiver 65 and that includes the phase and/or the amplitude, to obtain a phase and/or an amplitude of the receive channel.

(5) If amplitudes and/or phases of the receive channels are equal, or a difference between amplitudes and/or phases of the receive channels is less than or equal to a specified threshold, correction on the receive channels ends. If the difference between the amplitudes and/or the phases of the receive channels is greater than the specified threshold, the signal processor 66 compensates for the difference between the amplitudes and/or the phases of the receive channels, so that the amplitudes and/or the phases of all the receive channels are equal or the difference between the amplitudes and/or the phases of the receive channels is less than or equal to the specified threshold. The signal processor 66 feeds back an amplitude and/or a phase that are/is of each receive channel and that are/is obtained after the compensation to the beam controller 63.

(6) The beam controller 63 distributes a group of control signals for calibrating the receive channel to the phase shifter/the attenuator 62 at a high speed, and adjusts the phase and/or the amplitude of each receive channel based on each phase shifter/attenuator 62, so that the phases and/or the amplitudes of all the receive channels are equal or the difference between the phases and/or the amplitudes of the receive channels is less than or equal to the specified threshold.

A method for calibrating a phased array antenna provided in this embodiment of this application may be applicable to a terminal that includes a phased array antenna and the calibration system that is shown in FIG. 6. The method for calibrating a phased array antenna may be performed by the signal processor 66 in the calibration system shown in FIG. 6, or may be performed by other more signal processing units included in the terminal. This is not limited herein. In this embodiment of this application, a plurality of calibration antenna elements jointly transmit a calibration signal to a service antenna element corresponding to each receive channel, so that the service antenna element corresponding to each receive channel can receive a strongest calibration signal corresponding to each receive channel. The signal processor 66 and/or another signal processing unit may compensate for an amplitude and/or a phase of a calibration signal corresponding to each receive channel, so that the receive channels in the phased array antenna have equal amplitudes and/or phases.

Figure 7:
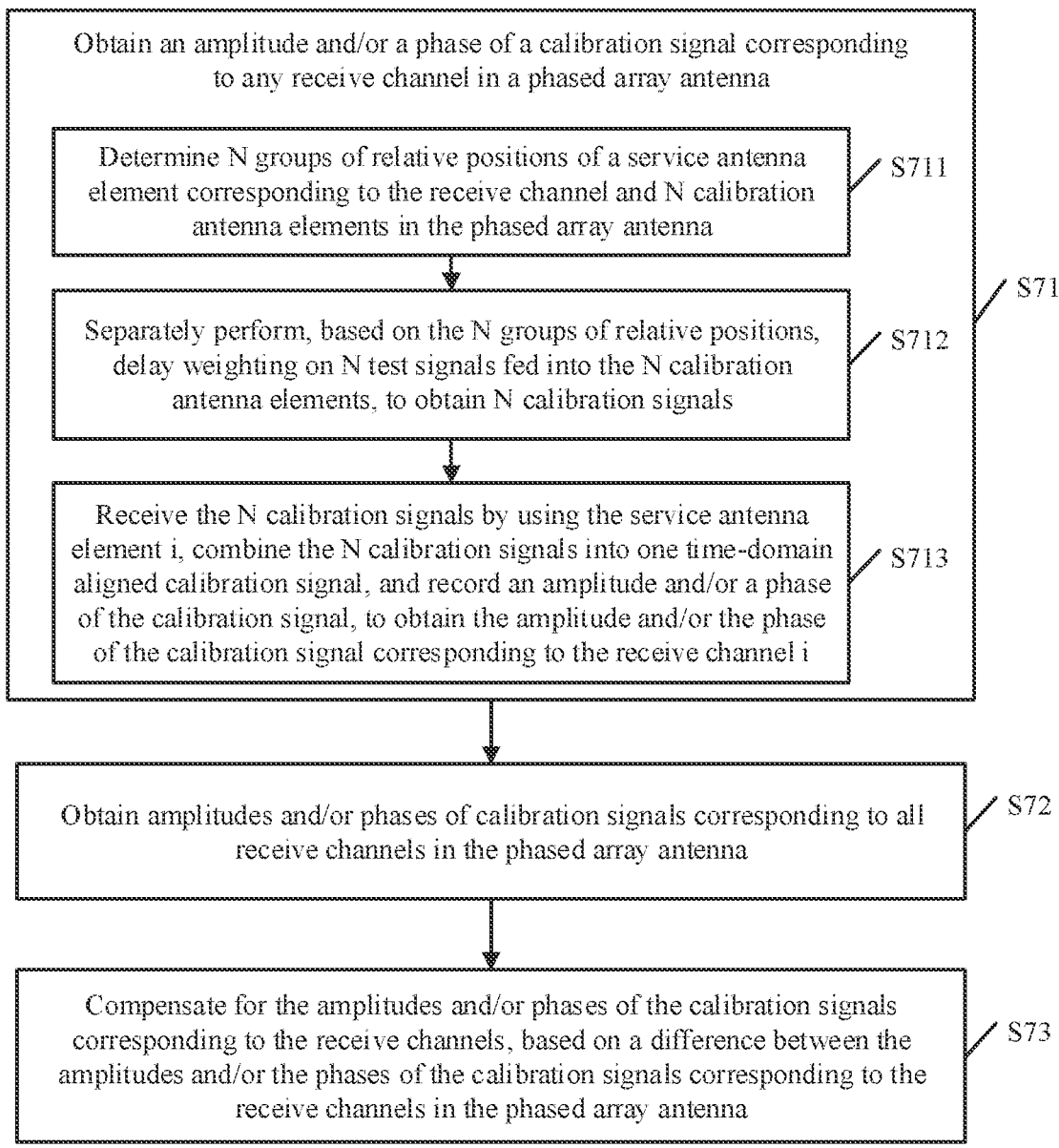
FIG. 7 is another schematic flowchart of a method for calibrating a phased array antenna according to an embodiment of this application.

FIG. 7 is another schematic flowchart of a method for calibrating a phased array antenna according to an embodiment of this application. The method for calibrating a phased array antenna shown in FIG. 7 is applicable to calibration of a receive channel in the phased array antenna, and may include the following steps.

S71. Obtain an amplitude and/or a phase of a calibration signal corresponding to any receive channel in the phased array antenna.

In some feasible implementations, in a process of calibrating each receive channel in the phased array antenna, a test signal used for calibrating the receive channel first passes through a calibration antenna element, is radiated by the calibration antenna element, and is received by a service antenna element in the phased array antenna. A calibration signal corresponding to any receive channel may be obtained based on a manner of receiving a calibration signal from one or more calibration antenna elements by a service antenna element corresponding to any receive channel in the phased array antenna. For ease of description, for example, the receive channel may be a receive channel i, where i is an integer greater than zero and less than a total quantity (which, for ease of description, may be set to M) of receive channels in the phased array antenna.

In some feasible implementations, the calibration signal corresponding to the receive channel in the phased array antenna may be obtained through processing in implementations provided in the following steps S711 to S713.

S711. Determine N groups of relative positions of a service antenna element corresponding to the receive channel and N calibration antenna elements in the phased array antenna.

In some feasible implementations, for ease of description, for example, a service antenna element corresponding to the receive channel i may be a service antenna element i, and the receive channel in the phased array antenna may be a receive channel i. Correspondingly, that a test signal used to calibrate the receive channel i may be a test signal di is used as an example for description. The test signal di may be radiated by one or more calibration antenna elements in the phased array antenna, and received by the service antenna element i corresponding to the receive channel i.

In some feasible implementations, to calibrate the receive channel i, a distance between the service antenna element i and a calibration antenna element (for ease of description, a calibration antenna element i may be used as an example for description) in an antenna subarray to which the service antenna element i belongs may be first determined. When the distance between the service antenna element i and the calibration antenna element i is greater than or equal to a preset distance threshold, a coupling signal between the service antenna element i and the calibration antenna element i is obtained. N−1 calibration antenna elements other than the calibration antenna element i are determined in the calibration antenna elements included in the phased array antenna, based on a signal-to-noise ratio of the coupling signal between the service antenna element i and the calibration antenna element i, to obtain the N calibration antenna elements that include the calibration antenna element i. The N calibration antenna elements may be coupled to the service antenna element i at time points $t_0$ to $t_{n=N-1}$ respectively.

Optionally, referring to an implementation corresponding to transmit channel calibration in Embodiment 1, in a process of calibrating a receive channel, it may also be determined, based on a relative position relationship between the service antenna element i and the calibration antenna element i, to perform processing by using a corresponding signal processing policy, to obtain a calibration signal corresponding to the receive channel i.

In some feasible implementations, in different signal processing policies, receive channels corresponding to service antenna elements in different positions may be calibrated by using different quantities of calibration antenna elements, to control, for the service antenna elements in the different positions, beams that point to different directions in antenna patterns, so that a service antenna element in each position can receive a strongest signal. Optionally, a receive channel corresponding to a service antenna element that is relatively close to a calibration antenna element may be calibrated by using the single calibration antenna element by sending and/or receiving a signal. Because a coupling degree between a service antenna element and a calibration antenna element decreases as a distance between the two antenna elements increases, a receive channel corresponding to a service antenna element that is relatively far away from a calibration antenna element may be calibrated by using a plurality of calibration antenna elements by sending and/or receiving signals. For example, to calibrate the receive channel i, if a distance between the service antenna element i and the calibration antenna element i is greater than or equal to a preset distance threshold, a plurality of calibration antenna elements including the calibration antenna element i may be used to jointly calibrate the receive channel i. If the distance between the service antenna element i and the calibration antenna element i is less than the preset distance threshold, the calibration antenna element i may be used to calibrate the receive channel i. Optionally, to improve precision of calibrating the receive channel i, when the distance between the service antenna element i and the calibration antenna element i is less than the preset distance threshold, alternatively, a plurality of calibration antenna elements including the calibration antenna element i may be used to jointly calibrate the receive channel i. This may be specifically determined based on an actual application scenario, and is not limited herein. The following provides descriptions by using an example in which a plurality of calibration antenna elements including the calibration antenna element i are used to jointly calibrate the receive channel i. In other words, a plurality of calibration antenna elements selected for calibrating any receive channel include at least a calibration antenna element in an antenna subarray to which a service antenna element corresponding to the receive channel belongs. Details are not further described below. For ease of description, for example, the plurality of calibration antenna elements may be N calibration antenna elements, where N is greater than or equal to 2 and is less than or equal to a total quantity of calibration antenna elements in the phased array antenna.

In some feasible implementations, if it is determined that N calibration antenna elements are used to jointly calibrate the receive channel i, a coupling signal (which may be set to a second coupling signal, and for ease of description, a coupling signal i may be used as an example for description) between the service antenna element i and the calibration antenna element i may be obtained, and further, N−1 calibration antenna elements other than the calibration antenna element i may be determined in a plurality of calibration antenna elements coupled to the service antenna element i in the phased array antenna, based on a signal-to-noise ratio of the coupling signal i. Optionally, a quantity (that is, N in N−1) of calibration antenna elements and positions of the calibration antenna elements may be determined and selected based on a signal-to-noise ratio of the coupling signal i and a signal-to-noise ratio for receiving a strongest coupling signal by the calibration antenna element in the phased array antenna and in combination with a position of each calibration antenna element in the phased array antenna, so that each calibration antenna element can receive a strongest coupling signal. Specifically, the quantity (N is used as an example for description) of calibration antenna elements and the positions of the calibration antenna elements may be determined and selected based on an actual application scenario, and are not limited herein. The N calibration antenna elements including the calibration antenna element i may be coupled to the service antenna element i at time points $t_0$ to $t_{n=N-1}$ respectively.

In some feasible implementations, the N calibration antenna elements may be determined in the plurality of calibration antenna elements of the phased array antenna in the foregoing implementation, and further, the relative positions between the calibration antenna elements in the N calibration antenna elements and the service antenna element i may be determined, to obtain the N groups of relative positions. A distance between each of the N calibration antenna elements and the service antenna element i may be represented by relative positions of the two antenna elements. In this way, delay weighting may be performed, based on the distance between each calibration antenna element and the service antenna element i, on a test signal fed into each calibration antenna element, so that N calibration signals radiated to the service antenna element i by the calibration antenna elements are aligned in time domain.

S712. Separately perform, based on the N groups of relative positions, delay weighting on the N test signals fed into the N calibration antenna elements, to obtain N calibration signals.

In some feasible implementations, because the distances between the calibration antenna elements in the N calibration antenna elements and service antenna element i are different, the test signal fed into each calibration antenna element is received by the service antenna element i after being radiated by each calibration antenna element. The service antenna element i has a different delay in receiving a test signal from each calibration antenna element. Therefore, to ensure that test signals radiated from the calibration antenna elements to the service antenna element i have a same delay, delay weighting may be first performed on the test signals fed into the calibration antenna elements, so that the calibration signals arriving at the service antenna element i are aligned in time domain. The service antenna element i may receive, from the N calibration antenna elements, the N calibration signals that are delay aligned. The service antenna element i may combine the received N calibration signals into one time-domain aligned calibration signal, so that the calibration signal obtained through combination may be determined as the calibration signal corresponding to the receive channel i.

Figure 8:
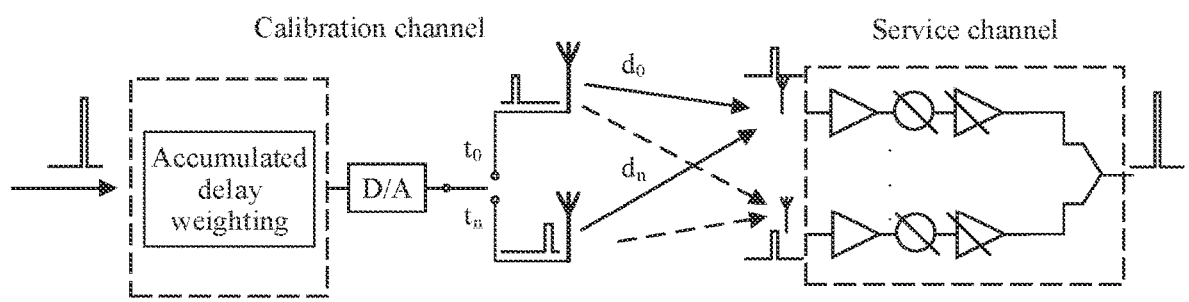
FIG. 8 is a schematic diagram of signal processing for calibrating a receive channel according to an embodiment of this application.

FIG. 8 is a schematic diagram of signal processing for calibrating a receive channel according to an embodiment of this application. As shown in FIG. 8, to calibrate each receive channel in the phased array antenna, relative positions of a service antenna element corresponding to each receive channel and each calibration antenna element may be first determined, and time-domain delay weighting is performed on each test signal fed into each calibration antenna element in digital domain, to obtain N calibration signals. The N calibration signals may be received by the service antenna element corresponding to each receive channel, and combined into one calibration signal through signal superposition (that is, amplitude superposition and enhancement), to obtain a calibration signal corresponding to each receive channel. For the calibration signal corresponding to each receive channel, delay weighting may be first performed on each test signal fed into each calibration antenna element to obtain N calibration signals, and then D/A conversion (that is, digital-to-analog conversion) may be performed on the N calibration signals, and then the N calibration signals are radiated by the calibration antenna elements. That is, the N calibration signals obtained through delay weighting are converted from digital signals into analog signals, and then may be radiated by the N calibration antenna elements and received by the service antenna elements corresponding to the receive channels. As shown in FIG. 8, in a process of calibrating each receive channel in the phased array antenna, a same calibration channel is shared for calibrating all receive channels, and on the calibration channel, the calibration signals obtained after the D/A conversion may be radiated, via the N calibration antenna elements at time points to to $t_{n=N-1}$ respectively through switching by using a switch, to the service antenna elements corresponding to the receive channels. For example, to calibrate the receive channel i, the calibration antenna elements in the N calibration antenna elements may be coupled to the service antenna element i at the time points $t_0$ to $t_{n=N-1}$ respectively. The service antenna element i may receive a calibration signal corresponding to the receive channel i from each calibration antenna element. Herein, the calibration signals fed into the calibration antenna elements have been aligned in time domain through delay weighting on the calibration channel when the calibration signals radiated by the calibration antenna elements arrive at the service antenna element, and the signals are superimposed on the service antenna element side. Therefore, the service antenna element i can receive a strongest calibration signal from each calibration antenna element.

Herein, in the process of calibrating each receive channel in the phased array antenna, the same calibration channel is shared for calibrating all receive channels. Therefore, an extra calibration error caused by different calibration channels can be avoided, impact of different calibration channels on precision of calibrating each receive channel can be avoided, and the precision of calibrating the receive channel in the phased array antenna is improved.

S713. Receive the N calibration signals by using the service antenna element i, combine the N calibration signals into one time-domain aligned calibration signal, and record an amplitude and/or a phase of the calibration signal, to obtain the amplitude and/or the phase of the calibration signal corresponding to the receive channel i.

In some feasible implementations, after the calibration signal corresponding to the receive channel i is fed into different calibration antenna elements in the N calibration antenna elements at different time points, the calibration antenna elements may be coupled to the service antenna element i at the time points $t_0$ to $t_{n=N-1}$ respectively. The service antenna element i may receive the calibration signal corresponding to the receive channel i from each calibration antenna element. After the service antenna element i receives the calibration signal radiated by each calibration antenna element, signal superposition (that is, amplitude superposition and enhancement) may be performed at the service antenna element i side to combine the signals into one time-domain aligned calibration signal, to obtain the calibration signal corresponding to the receive channel i. Further, the amplitude and/or the phase of the calibration signal obtained through combination may be determined as the amplitude and/or the phase corresponding to the receive channel i.

S72. Obtain amplitudes and/or phases of calibration signals corresponding to all the receive channels in the phased array antenna.

In some feasible implementations, a calibration signal corresponding to each receive channel in the phased array antenna can be obtained based on the implementations provided in the foregoing steps S711 to S713. Therefore, the calibration signals corresponding to all the receive channels in the phased array antenna can be obtained. In this case, the amplitudes and/or the phases of the calibration signals corresponding to all the receive channels in the phased array antenna can be obtained. For details, refer to the implementations described in steps S711 to S713, and details are not described herein again.

S73. Compensate for amplitudes and/or phases of the calibration signals corresponding to the receive channels, based on a difference between the amplitudes and/or the phases of the calibration signals corresponding to the receive channels in the phased array antenna.

In some feasible implementations, after the calibration signals corresponding to the receive channels are obtained, the difference between the amplitudes of the calibration signals corresponding to the receive channels may be calculated based on the obtained amplitudes of the calibration signals corresponding to the receive channels. Optionally, to calculate the difference between the amplitudes of the calibration signals corresponding to the receive channels, an amplitude of one of the receive channels may be used as a reference amplitude, and then a difference between the reference amplitude and an amplitude of each of the other receive channels may be calculated, to compensate for an amplitude, in each receive channel by using an attenuator, of a calibration signal corresponding to the receive channel, so that the calibration signals corresponding to the receive channels have equal amplitudes. Optionally, the amplitude of the calibration signal corresponding to each receive channel is compensated in each receive channel by using the attenuator, so that the amplitudes of the calibration signals corresponding to all the receive channels are equal to the reference amplitude. In this way, the amplitudes of all the receive channels in the phased array antenna are the same.

In some feasible implementations, after the calibration signals corresponding to the receive channels are obtained, the difference between the phases of the calibration signals corresponding to the receive channels may further be calculated based on the obtained phases of the calibration signals corresponding to the receive channels. Optionally, to calculate the difference between the phases of the calibration signals corresponding to the receive channels, a phase of one of the receive channels may be used as a reference phase, and then a difference between the reference phase and a phase of each of the other receive channels may be calculated, to compensate for a phase, in each receive channel by using a phase shifter, of a calibration signal corresponding to the receive channel, so that the calibration signals corresponding to the receive channels have equal phases. Optionally, the phase of the calibration signal corresponding to each receive channel is compensated in each receive channel by using the phase shifter, so that the phases of the calibration signals corresponding to all the receive channels are equal to the reference phase. In this way, the phases of all the receive channels in the phased array antenna are the same.

In this embodiment of this application, the amplitudes and/or the phases of the receive channels in the phased array antenna are compensated for, so that the receive channels in the phased array antenna have equal amplitudes and/or phases. In this way, the phased array antenna can receive a strongest signal, and performance of the phased array antenna can be guaranteed. Implementation complexity is low, and applicability is higher.

Figure 9:
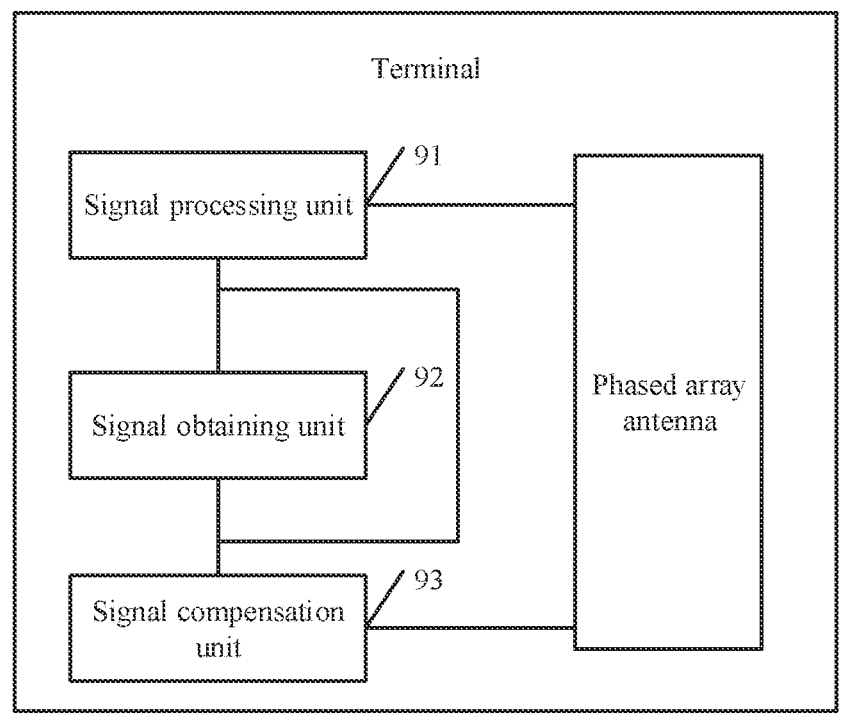
FIG. 9 is a schematic structural diagram of a terminal according to an embodiment of this application.

FIG. 9 is a schematic structural diagram of a terminal according to an embodiment of this application. As shown in FIG. 9, the terminal provided in this embodiment of this application includes a phased array antenna, and the phased array antenna includes a plurality of service antenna elements and a plurality of calibration antenna elements that are deployed independently of the plurality of service antenna elements. The plurality of service antenna elements are grouped into a plurality of antenna subarrays based on the plurality of calibration antenna elements, and one calibration antenna element corresponds to one antenna subarray. The terminal provided in this embodiment of this application further includes:

a signal processing unit 91, configured to perform the following operations on a test signal transmitted through any transmit channel n in the phased array antenna, to obtain a calibration signal corresponding to the transmit channel n:

transmitting any test signal through the transmit channel n, where the test signal is radiated by a service antenna element n corresponding to the transmit channel n and is received by a calibration antenna element in the phased array antenna;

obtaining N coupling signals received by N calibration antenna elements coupled to the service antenna element n, where N is greater than or equal to 2 and is less than or equal to a total quantity of calibration antenna elements in the phased array antenna; and performing delay weighting on the N coupling signals based on relative positions of the service antenna element n and each of the N calibration antenna elements to obtain N calibration signals aligned in time domain; and combining the N calibration signals into the calibration signal corresponding to the transmit channel n:

a signal obtaining unit 92, configured to obtain calibration signals that correspond to all transmit channels in the phased array antenna and that are obtained by the signal processing unit 91; and a signal compensation unit 93, configured to compensate for amplitudes and/or phases of the transmit channels based on a difference between the amplitudes and/or the phases of the calibration signals that correspond to the transmit channels in the phased array antenna and that are obtained by the signal obtaining unit 92, so that the transmit channels in the phased array antenna have equal amplitudes and/or phases.

In some feasible implementations, the N calibration antenna elements in the phased array antenna that are coupled to the service antenna element n include a calibration antenna element n corresponding to an antenna subarray to which the service antenna element n belongs. The signal processing unit 91 is configured to:

obtain a first coupling signal between the service antenna element n and the calibration antenna element n, and determine, in the calibration antenna elements in the phased array antenna that are coupled to the service antenna element n, N−1 calibration antenna elements other than the calibration antenna element n based on a signal-to-noise ratio of the first coupling signal, and obtain N−1 coupling signals received by the N−1 calibration antenna elements, to obtain the N coupling signals that include the first coupled signal, where the N calibration antenna elements are coupled to the service antenna element i at time points $t_0$ to $t_{N-1}$ respectively.

In some feasible implementations, the signal compensation unit 93 is configured to:

calculate the difference between the amplitudes of the calibration signals that correspond to the transmit channels in the phased array antenna and that are obtained by the signal obtaining unit 92, and compensate for, in the transmit channels by using an attenuator, the amplitudes of the calibration signals corresponding to the transmit channels, so that the calibration signals corresponding to the transmit channels have equal amplitudes.

In some feasible implementations, the signal compensation unit 93 is configured to:

calculate the difference between the phases of the calibration signals that correspond to the transmit channels in the phased array antenna and that are obtained by the signal obtaining unit 92, and compensate for, in the transmit channels by using a phase shifter, the phases of the calibration signals corresponding to the transmit channels, so that the calibration signals corresponding to the transmit channels have equal phases.

In some feasible implementations, a calibration antenna element corresponding to any antenna subarray in the phased array antenna is deployed in a central position or at a peripheral edge of all service antenna elements included in the antenna subarray.

In some feasible implementations, the calibration antenna elements in the phased array antenna include a monopole antenna element, a slotted waveguide antenna element, and/or another antenna element whose radiation direction is orthogonal to a radiation direction of a service antenna element in the phased array antenna.

In some feasible implementations, the signal processing unit 91 may be configured to perform the implementations provided in the steps (S411 to S413) in step S41 in the embodiment shown in FIG. 4. The signal obtaining unit 92 may be configured to perform the implementation provided in step S42 in the embodiment shown in FIG. 4. The signal compensation unit 93 may be configured to perform the implementation provided in step S43 in the embodiment shown in FIG. 4. The terminal may perform, by using the built-in units of the terminal, the implementations provided for calibrating a transmit channel in a phased array antenna in FIG. 3 to FIG. 5. For details, refer to the implementations provided in the steps in the foregoing embodiments. Details are not described herein again. Herein, the units included in the terminal may be units included in the signal processor 36 in the system shown in FIG. 3, and may be specifically determined based on an actual application scenario. This is not limited herein. The terminal provided in the embodiments of this application can also achieve beneficial effects (or advantages) of the implementations provided in the steps in the foregoing embodiments, and details are not described herein again.

Figure 10:
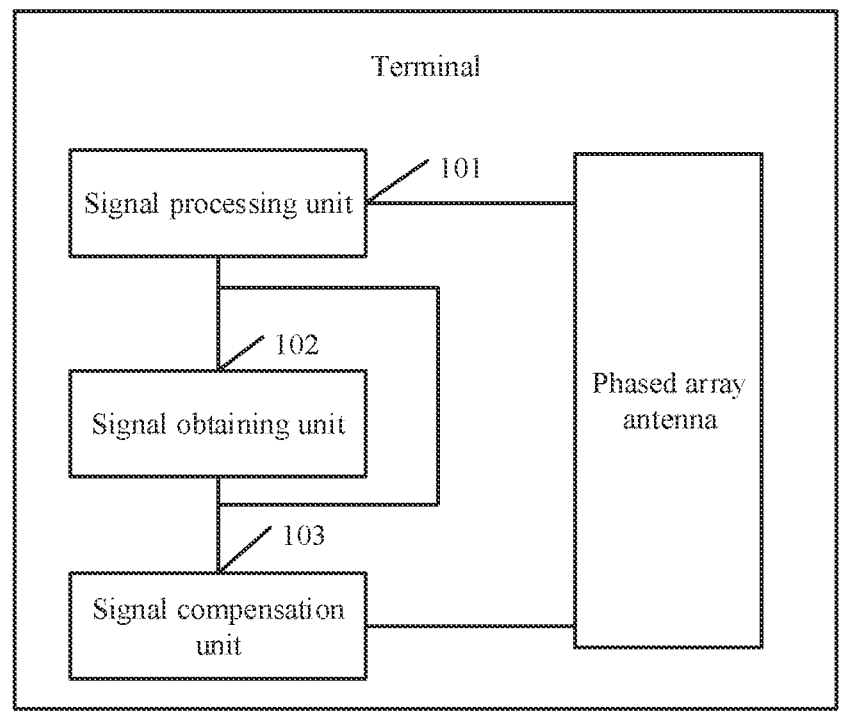
FIG. 10 is another schematic structural diagram of a terminal according to an embodiment of this application.

FIG. 10 is another schematic structural diagram of a terminal according to an embodiment of this application. As shown in FIG. 10, the terminal provided in this embodiment of this application includes a phased array antenna, and the phased array antenna includes a plurality of service antenna elements and a plurality of calibration antenna elements that are deployed independently of the plurality of service antenna elements. The plurality of service antenna elements are grouped into a plurality of antenna subarrays based on the plurality of calibration antenna elements, and one calibration antenna element corresponds to one antenna subarray. The terminal provided in this embodiment of this application further includes:

a signal processing unit 101, configured to obtain, by performing the following step 1 to step 3, an amplitude and/or a phase of a calibration signal corresponding to any receive channel i in the phased array antenna:

step 1: determining N groups of relative positions of a service antenna element i corresponding to the receive channel i and N calibration antenna elements in the phased array antenna, where N is greater than or equal to 2 and is less than or equal to a total quantity of calibration antenna elements in the phased array antenna;

step 2: separately performing, based on the N groups of relative positions, delay weighting on N test signals fed into the N calibration antenna elements, to obtain N calibration signals, where the N calibration signals are radiated by the N calibration antenna elements and are received by the service antenna element in the phased array antenna; and step 3: receiving the N calibration signals by using the service antenna element i, combining the N calibration signals into one time-domain aligned calibration signal, and recording an amplitude and/or a phase of the time-domain aligned calibration signal, to obtain the amplitude and/or the phase of the calibration signal corresponding to the receive channel i;

a signal obtaining unit 102, configured to obtain amplitudes and/or phases that are of calibration signals corresponding to all receive channels in the phased array antenna and that are obtained by the signal processing unit 101; and a signal compensation unit 103, configured to compensate for the amplitudes and/or the phases of the calibration signals corresponding to the receive channels, based on a difference between the amplitudes and/or the phases that are of the calibration signals corresponding to the receive channels in the phased array antenna and that are obtained by the signal obtaining unit 102, so that the receive channels in the phased array antenna have equal amplitudes and/or phases.

In some feasible implementations, the signal processing unit 101 is further configured to:

determine a distance between the service antenna element i and a calibration antenna element i corresponding to an antenna subarray to which the service antenna element i belongs;

when the distance between the service antenna element i and the calibration antenna element i is greater than or equal to a preset distance threshold, obtain a coupling signal between the service antenna element i and the calibration antenna element i; and determine, in the calibration antenna elements included in the phased array antenna, N−1 calibration antenna elements other than the calibration antenna element i based on a signal-to-noise ratio of the coupling signal between the service antenna element i and the calibration antenna element i, to obtain the N calibration antenna elements that include the calibration antenna element i, where the N calibration antenna elements are coupled to the service antenna element i at time points $t_0$ to $t_{N-1}$ respectively.

In some feasible implementations, the signal compensation unit 103 is configured to:

calculate the difference between the amplitudes of the calibration signals corresponding to the receive channels in the phased array antenna, and compensate for in the receive channels by using an attenuator, the amplitudes of the calibration signals corresponding to the receive channels, so that the calibration signals corresponding to the receive channels have equal amplitudes.

In some feasible implementations, the signal compensation unit 103 is configured to:

calculate the difference between the phases of the calibration signals corresponding to the receive channels in the phased array antenna, and compensate for, in the receive channels by using a phase shifter, the phases of the calibration signals corresponding to the receive channels, so that the calibration signals corresponding to the receive channels have equal phases.

In some feasible implementations, a calibration antenna element corresponding to any antenna subarray in the phased array antenna is deployed in a central position or at a peripheral edge of all service antenna elements included in the antenna subarray.

In some feasible implementations, the calibration antenna elements in the phased array antenna include a monopole antenna element, a slotted waveguide antenna element, and/or another antenna element whose radiation direction is orthogonal to a radiation direction of a service antenna element in the phased array antenna.

In some feasible implementations, the signal processing unit 101 may be configured to perform the implementations provided in the steps (S711 to S713) in step S71 in the embodiment shown in FIG. 7. The signal obtaining unit 102 may be configured to perform the implementation provided in step S72 in the embodiment shown in FIG. 7. The signal compensation unit 103 may be configured to perform the implementation provided in step S73 in the embodiment shown in FIG. 7. The terminal may perform, by using the built-in units of the terminal, the implementations provided for calibrating a receive channel in a phased array antenna in FIG. 6 to FIG. 8. For details, refer to the implementations provided in the steps in the foregoing embodiments. Details are not described herein again. Herein, the units included in the terminal may be units included in the signal processor 66 in the system shown in FIG. 6, and may be specifically determined based on an actual application scenario. This is not limited herein. The terminal provided in the embodiments of this application can also achieve beneficial effects (or advantages) of the implementations provided in the steps in the foregoing embodiments, and details are not described herein again.

Figure 11:
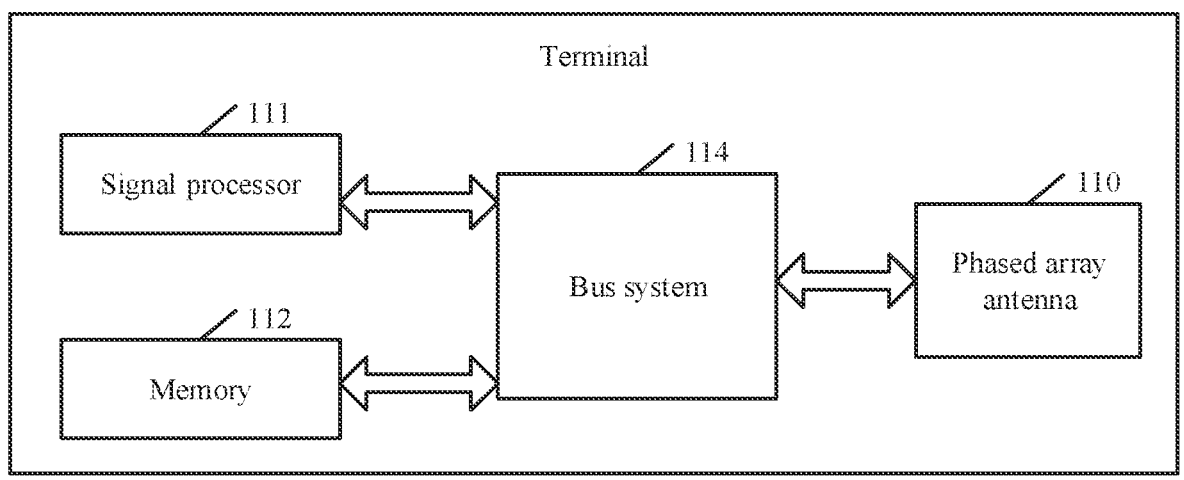
FIG. 11 is another schematic structural diagram of a terminal according to an embodiment of this application.

FIG. 11 is another schematic structural diagram of a terminal according to an embodiment of this application. As shown in FIG. 11, the terminal provided in this embodiment of this application includes a phased array antenna 110, a signal processor 111, a memory 112, and a bus system 114.

The phased array antenna 110, the signal processor 111, and the memory 112 are connected by using the bus system 114.

The memory 112 is configured to store a program. Specifically, the program may include program code. The program code includes a computer operation instruction. The memory 112 includes but is not limited to a random access memory (RAM), a read-only memory (ROM), an erasable programmable read-only memory (EPROM), or a compact disc read-only memory (CD-ROM). Only one memory is shown in FIG. 11. Certainly, a plurality of memories may be disposed as required. The memory 112 may alternatively be a memory in the signal processor 111. This is not limited herein.

The memory 112 stores the following elements: an executable module or a data structure, a subset thereof, or an extended set thereof:

an operation instruction, including various operation instructions and used to implement various operations; and an operating system, including various system programs and used to implement various basic services and process a hardware-based task.

The signal processor 111 may be one or more central processing units (CPU). When the signal processor 111 is one CPU, the CPU may be a single-core CPU or a multi-core CPU.

In a specific application, the components of the terminal are coupled together by using the bus system 114, where the bus system 114 may include a power bus, a control bus, a status signal bus, and the like in addition to a data bus. This is not limited herein. However, for clarity of description, various types of buses in FIG. 11 are marked as the bus system 114. For ease of illustration, FIG. 11 shows merely an example of the bus system 114.

Herein, the signal processor 111 may be the signal processor 36 in the system shown in FIG. 3 and/or the signal processor 66 in the system shown in FIG. 6. The methods provided in the embodiments shown in FIG. 4 and FIG. 5 and/or FIG. 7 and FIG. 8 may be applied to the signal processor 111, or may be implemented by the signal processor 111. The signal processor 111 may be an integrated circuit chip and has a signal processing capability. In an implementation process, steps in the foregoing method can be implemented by using a hardware integrated logical circuit in the signal processor 111, or by using instructions in a form of software. The foregoing signal processor 111 may be a general-purpose processor, a digital signal processor (DSP), an application-specific integrated circuit (ASIC), a field programmable gate array (FPGA) or another programmable logic device, a discrete gate or a transistor logic device, or a discrete hardware component. The methods, the steps, and the logical block diagrams that are disclosed in the embodiments of this application may be implemented or performed. The general-purpose processor may be a microprocessor, or the processor may be any conventional processor or the like. The steps of the methods disclosed with reference to the embodiments of this application may be directly executed and completed by using a hardware decoding processor, or may be executed and completed by using a combination of hardware and software modules in the decoding processor. A software module may be located in a mature storage medium in the art, such as a random access memory, a flash memory, a read-only memory, a programmable read-only memory, an electrically erasable programmable memory, a register, or the like. The storage medium is located in the memory 112. The signal processor 111 may read information in the memory 112, and perform, in combination with hardware of the signal processor 111, the steps of the method for calibrating a transmit channel in a phased array antenna described in the embodiments shown in FIG. 4 and FIG. 5; or perform, in combination with hardware of the signal processor 111, the steps of the method for calibrating a receive channel in a phased array antenna described in the embodiments shown in FIG. 7 and FIG. 8. The terminal provided in the embodiments of this application can also achieve beneficial effects (or advantages) of the implementations provided in the steps in the foregoing embodiments, and details are not described herein again.

An embodiment of this application provides a computer-readable storage medium. The computer-readable storage medium stores an instruction. When the instruction is run on a terminal, the terminal is enabled to perform the method for calibrating a transmit channel in a phased array antenna described in each step in the embodiments shown in FIG. 3 to FIG. 5, or an implementation that is for calibrating a transmit channel in a phased array antenna and that is performed by the terminal in the foregoing embodiments. For details, refer to the implementations provided in the foregoing embodiments. Details are not described herein again.

An embodiment of this application provides a computer-readable storage medium. The computer-readable storage medium stores an instruction. When the instruction is run on a terminal, the terminal is enabled to perform the method for calibrating a receive channel in a phased array antenna described in each step in the embodiments shown in FIG. 6 to FIG. 8, or an implementation that is for calibrating a receive channel in a phased array antenna and that is performed by the terminal in the foregoing embodiments. For details, refer to the implementations provided in the foregoing embodiments. Details are not described herein again.

An embodiment of this application provides a computer program product including an instruction. When the computer program product runs on a terminal, the terminal is enabled to perform the method for calibrating a transmit channel in a phased array antenna described in each step in the embodiments shown in FIG. 3 to FIG. 5, or an implementation that is for calibrating a transmit channel in a phased array antenna and that is performed by the terminal in the foregoing embodiments. For details, refer to the implementations provided in the foregoing embodiments. Details are not described herein again.

An embodiment of this application provides a computer program product including an instruction. When the computer program product runs on a terminal, the terminal is enabled to perform the method for calibrating a receive channel in a phased array antenna described in each step in the embodiments shown in FIG. 6 to FIG. 8, or an implementation that is for calibrating a receive channel in a phased array antenna and that is performed by the terminal in the foregoing embodiments. For details, refer to the implementations provided in the foregoing embodiments. Details are not described herein again.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method for calibrating a phased array antenna, wherein the phased array antenna comprises a plurality of service antenna elements and a plurality of calibration antenna elements that are deployed independently of the plurality of service antenna elements, wherein the plurality of service antenna elements are grouped into a plurality of antenna subarrays based on the plurality of calibration antenna elements, wherein one calibration antenna element corresponds to one antenna subarray, and wherein the method comprises:
    performing the following operations on a test signal transmitted through a transmit channel n in the phased array antenna, to obtain a calibration signal corresponding to the transmit channel n:
        transmitting the test signal through the transmit channel n, wherein the test signal is radiated by a service antenna element n corresponding to the transmit channel n and is received by a calibration antenna element in the phased array antenna;
        obtaining N coupling signals received by N calibration antenna elements coupled to the service antenna element n, wherein N is greater than or equal to 2 and is less than or equal to a total quantity of calibration antenna elements in the phased array antenna;
        performing delay weighting on the N coupling signals based on relative positions of the service antenna element n and each of the N calibration antenna elements to obtain N calibration signals aligned in time domain; and
        combining the N calibration signals into the calibration signal corresponding to the transmit channel n;
    obtaining calibration signals corresponding to all transmit channels in the phased array antenna; and
    compensating for at least one of:
        amplitudes of the transmit channels based on a difference between amplitudes of the calibration signals corresponding to the transmit channels in the phased array antenna, wherein the transmit channels in the phased array antenna have equal amplitudes after the compensating; or
        phases of the transmit channels based on a difference between phases of the calibration signals corresponding to the transmit channels in the phased array antenna, wherein the transmit channels in the phased array antenna have equal phases after the compensating.

2. The method according to claim 1, wherein:
the N calibration antenna elements in the phased array antenna that are coupled to the service antenna element n comprise a calibration antenna element n corresponding to an antenna subarray to which the service antenna element n belongs; and
the obtaining N coupling signals received by N calibration antenna elements coupled to the service antenna element n comprises:
   obtaining a first coupling signal between the service antenna element n and the calibration antenna element n;
   determining, in the calibration antenna elements in the phased array antenna that are coupled to the service antenna element n, N−1 calibration antenna elements other than the calibration antenna element n based on a signal-to-noise ratio of the first coupling signal, and
   obtaining N−1 coupling signals received by the N−1 calibration antenna elements, to obtain the N coupling signals that comprise the first coupled signal, wherein the N calibration antenna elements are coupled to the service antenna element n at time points $t_0$ to $t_{N-1}$ respectively.

3. The method according to claim 1, wherein compensating for the amplitudes of the transmit channels comprises:
calculating the difference between the amplitudes of the calibration signals corresponding to the transmit channels in the phased array antenna; and
compensating for, in the transmit channels and by using an attenuator, the amplitudes of the calibration signals corresponding to the transmit channels, wherein the calibration signals corresponding to the transmit channels have equal amplitudes after the compensating.

4. The method according to claim 1, wherein compensating for the phases of the transmit channels comprises:
calculating the difference between the phases of the calibration signals corresponding to the transmit channels in the phased array antenna; and
compensating for, in the transmit channels and by using a phase shifter, the phases of the calibration signals corresponding to the transmit channels, wherein the calibration signals corresponding to the transmit channels have equal phases after the compensating.

5. The method according to claim 1, wherein a calibration antenna element corresponding to an antenna subarray in the phased array antenna is deployed in a central position or at a peripheral edge of all service antenna elements comprised in the antenna subarray.

6. The method according to claim 5, wherein the calibration antenna elements in the phased array antenna comprise at least one of a monopole antenna element, a slotted waveguide antenna element, or another antenna element whose radiation direction is orthogonal to a radiation direction of a service antenna element in the phased array antenna.

7. A method for calibrating a phased array antenna, wherein the phased array antenna comprises a plurality of service antenna elements and a plurality of calibration antenna elements that are deployed independently of the plurality of service antenna elements, wherein the plurality of service antenna elements are grouped into a plurality of antenna subarrays based on the plurality of calibration antenna elements, wherein one calibration antenna element corresponds to one antenna subarray, and wherein the method comprises:

obtaining at least one of an amplitude or a phase of a calibration signal corresponding to a receive channel i in the phased array antenna, wherein the obtaining comprises:
   determining N groups of relative positions of a service antenna element i corresponding to the receive channel i and N calibration antenna elements in the phased array antenna, wherein N is greater than or equal to 2 and is less than or equal to a total quantity of calibration antenna elements in the phased array antenna:
   separately performing, based on the N groups of relative positions, delay weighting on N test signals fed into the N calibration antenna elements, to obtain N calibration signals, wherein the N calibration signals are radiated by the N calibration antenna elements and are received by the service antenna element in the phased array antenna;
   receiving the N calibration signals by using the service antenna element i;
   combining the N calibration signals into one time-domain aligned calibration signal; and
   recording at least one of an amplitude or a phase of the time-domain aligned calibration signal, to obtain the at least one of an amplitude or a phase of the calibration signal corresponding to the receive channel i;
obtaining at least one of amplitudes or phases of calibration signals corresponding to all receive channels in the phased array antenna; and
compensating for at least one of:
   the amplitudes of the calibration signals corresponding to the receive channels, based on a difference between the amplitudes of the calibration signals corresponding to the receive channels in the phased array antenna, wherein the receive channels in the phased array antenna have equal amplitudes after the compensating; or
   the phases of the calibration signals corresponding to the receive channels, based on a difference between the phases of the calibration signals corresponding to the receive channels in the phased array antenna, wherein the receive channels in the phased array antenna have equal phases after the compensating.

8. The method according to claim 7, wherein before the determining N groups of relative positions of a service antenna element i corresponding to the receive channel i and N calibration antenna elements in the phased array antenna, the method further comprises:
determining a distance between the service antenna element i and a calibration antenna element i corresponding to an antenna subarray to which the service antenna element i belongs;
when the distance between the service antenna element i and the calibration antenna element i is greater than or equal to a preset distance threshold, obtaining a coupling signal between the service antenna element i and the calibration antenna element i; and
determining, in the calibration antenna elements comprised in the phased array antenna, N−1 calibration antenna elements other than the calibration antenna element i based on a signal-to-noise ratio of the coupling signal between the service antenna element i and the calibration antenna element i, to obtain the N calibration antenna elements that comprise the calibration antenna element i, wherein the N calibration antenna elements are coupled to the service antenna element i at time points $t_0$ to $t_{N-1}$ respectively.

9. The method according to claim 7, wherein compensating for the amplitudes of the calibration signals corresponding to the receive channels comprises:
calculating the difference between the amplitudes of the calibration signals corresponding to the receive channels in the phased array antenna; and
compensating for, in the receive channels and by using an attenuator, the amplitudes of the calibration signals corresponding to the receive channels, wherein the calibration signals corresponding to the receive channels have equal amplitudes after the compensating.

10. The method according to claim 7, wherein compensating for the phases of the calibration signals corresponding to the receive channels comprises:
calculating the difference between the phases of the calibration signals corresponding to the receive channels in the phased array antenna; and
compensating for, in the receive channels and by using a phase shifter, the phases of the calibration signals corresponding to the receive channels, wherein the calibration signals corresponding to the receive channels have equal phases after the compensating.

11. The method according to claim 7, wherein a calibration antenna element corresponding to an antenna subarray in the phased array antenna is deployed in a central position or at a peripheral edge of all service antenna elements comprised in the antenna subarray.

12. The method according to claim 11, wherein the calibration antenna elements in the phased array antenna comprise at least one of a monopole antenna element, a slotted waveguide antenna element, or another antenna element whose radiation direction is orthogonal to a radiation direction of a service antenna element in the phased array antenna.

13. A terminal, wherein the terminal comprises a phased array antenna, wherein the phased array antenna comprises a plurality of service antenna elements and a plurality of calibration antenna elements that are deployed independently of the plurality of service antenna elements, wherein the plurality of service antenna elements are grouped into a plurality of antenna subarrays based on the plurality of calibration antenna elements, wherein one calibration antenna element corresponds to one antenna subarray, and wherein the terminal comprises:
at least one processor; and
a non-transitory computer-readable storage medium coupled to the at least one processor and storing programming instructions for execution by the at least one processor, wherein the programming instructions instruct the at least one processor to:
perform the following operations on a test signal transmitted through a transmit channel n in the phased array antenna, to obtain a calibration signal corresponding to the transmit channel n:
transmitting the test signal through the transmit channel n, wherein the test signal is radiated by a service antenna element n corresponding to the transmit channel n and is received by a calibration antenna element in the phased array antenna;
obtaining N coupling signals received by N calibration antenna elements coupled to the service antenna element n, wherein N is greater than or equal to 2 and is less than or equal to a total quantity of calibration antenna elements in the phased array antenna;
performing delay weighting on the N coupling signals based on relative positions of the service antenna element n and each of the N calibration antenna elements to obtain N calibration signals aligned in time domain; and
combining the N calibration signals into the calibration signal corresponding to the transmit channel n;
obtain calibration signals that correspond to all transmit channels in the phased array antenna; and
compensate for at least one of:
amplitudes of the transmit channels based on a difference between amplitudes of the calibration signals that correspond to the transmit channels in the phased array antenna, wherein the transmit channels in the phased array antenna have equal amplitudes after the compensating; or
phases of the transmit channels based on a difference between phases of the calibration signals that correspond to the transmit channels in the phased array antenna, w % herein the transmit channels in the phased array antenna have equal phases after the compensating.

14. The terminal according to claim 13, wherein:
the N calibration antenna elements in the phased array antenna that are coupled to the service antenna element n comprise a calibration antenna element n corresponding to an antenna subarray to which the service antenna element n belongs; and
the programming instructions instruct the at least one processor to:
obtain a first coupling signal between the service antenna element n and the calibration antenna element n;
determine, in the calibration antenna elements in the phased array antenna that are coupled to the service antenna element n, N−1 calibration antenna elements other than the calibration antenna element n based on a signal-to-noise ratio of the first coupling signal, and
obtain N−1 coupling signals received by the N−1 calibration antenna elements, to obtain the N coupling signals that comprise the first coupled signal, wherein the N calibration antenna elements are coupled to the service antenna element n at time points $t_0$ to $t_{N-1}$ respectively.

15. The terminal according to claim 13, wherein the programming instructions instruct the at least one processor to:
calculate the difference between the amplitudes of the calibration signals that correspond to the transmit channels in the phased array antenna; and
compensate for, in the transmit channels and by using an attenuator, the amplitudes of the calibration signals corresponding to the transmit channels, wherein the calibration signals corresponding to the transmit channels have equal amplitudes after the compensating.

16. The terminal according to claim 13, wherein the programming instructions instruct the at least one processor to:
calculate the difference between the phases of the calibration signals that correspond to the transmit channels in the phased array antenna; and
compensate for, in the transmit channels and by using a phase shifter, the phases of the calibration signals corresponding to the transmit channels, wherein the calibration signals corresponding to the transmit channels have equal phases after the compensating.

17. The terminal according to claim 13, wherein a calibration antenna element corresponding to an antenna subarray in the phased array antenna is deployed in a central position or at a peripheral edge of all service antenna elements comprised in the antenna subarray.

18. The terminal according to claim 17, wherein the calibration antenna elements in the phased array antenna comprise at least one of a monopole antenna element, a slotted waveguide antenna element, or another antenna element whose radiation direction is orthogonal to a radiation direction of a service antenna element in the phased array antenna.

* * * * *

UNITED STATES PATENT AND TRADEMARK OFFICE
CERTIFICATE OF CORRECTION

PATENT NO. : 11,811,147 B2
APPLICATION NO. : 17/141776
DATED : November 7, 2023
INVENTOR(S) : Tao Jiang, Jing Li and Zhiwei Zhang Page 1 of 1

It is certified that error appears in the above-identified patent and that said Letters Patent is hereby corrected as shown below:

In the Claims

Column 29, Line 18 (Approx.), Claim 2, please delete "signal," and insert therefore -- signal; --;

Column 30, Line 11 (Approx.), Claim 7, please delete "antenna:" and insert therefore -- antenna; --;

Column 32, Line 22, Claim 13, please delete "w % herein" and insert therefore -- wherein --;

Column 32, Line 40, Claim 14, please delete "signal," and insert -- signal; --.

Signed and Sealed this
Twenty-second Day of October, 2024

Katherine Kelly Vidal
*Director of the United States Patent and Trademark Office*